United States Patent
Takasu et al.

[11] Patent Number: 5,982,002
[45] Date of Patent: Nov. 9, 1999

[54] LIGHT VALVE HAVING A SEMICONDUCTOR FILM AND A FABRICATION PROCESS THEREOF

[75] Inventors: Hiroaki Takasu; Yoshikazu Kojima; Kunihiro Takahashi, all of Tokyo, Japan

[73] Assignee: Seiko Instruments Inc., Japan

[21] Appl. No.: 08/009,710

[22] Filed: Jan. 27, 1993

[51] Int. Cl.[6] .................................................. H01L 29/94
[52] U.S. Cl. .............................. 257/347; 257/59; 257/72; 257/286; 257/291; 257/348; 257/349; 257/351
[58] Field of Search .......................... 359/58, 59; 257/59, 257/72, 291, 327, 328, 335, 339, 342, 345, 347, 336, 68, 285, 258, 286, 386, 394, 403, 404, 505, 348, 349, 351, 352, 353, 354

[56] References Cited

U.S. PATENT DOCUMENTS

| | | | |
|---|---|---|---|
| 4,242,691 | 12/1980 | Kotani et al. | 257/327 |
| 4,775,641 | 10/1988 | Duffy et al. | 259/349 |
| 4,948,231 | 8/1990 | Aoki et al. | 257/59 |
| 4,984,033 | 1/1991 | Ishizu et al. | 257/347 |
| 5,140,391 | 8/1992 | Hayashi et al. | 257/347 |
| 5,166,765 | 11/1992 | Lee et al. | 259/345 |
| 5,182,624 | 1/1993 | Tran et al. | 257/59 |
| 5,233,211 | 8/1993 | Hayashi et al. | 257/347 |
| 5,305,128 | 4/1994 | Stupp et al. | 359/59 |
| 5,315,132 | 5/1994 | Yamazaki | 257/403 |
| 5,349,154 | 9/1994 | Takahashi et al. | 257/347 |

FOREIGN PATENT DOCUMENTS

| | | | |
|---|---|---|---|
| 0486318 | 5/1992 | European Pat. Off. | |
| 60-263466 | 12/1985 | Japan | 257/345 |
| 61-105872 | 5/1986 | Japan | 257/336 |
| 62-5661 | 1/1987 | Japan | 257/72 |
| 1-239530 | 9/1989 | Japan | 359/59 |
| 1-307268 | 12/1989 | Japan | 257/347 |
| 4-116984 | 4/1992 | Japan | 257/347 |

OTHER PUBLICATIONS

Patent Abstracts of Japan, vol. 15, No. 287 (P–1229) Jul. 22, 1991.
Patent Abstracts of Japan, vol. 10, No. 1 (E–371) Jan. 7, 1986.
Patent Abstracts of Japan, vol. 13, No. 578 (E–864) Dec. 20, 1989.

*Primary Examiner*—Valencia Martin-Wallace
*Attorney, Agent, or Firm*—Adams & Wilks

[57] ABSTRACT

A miniaturized light valve with a surface area on the order of several centimeters may be successfully formed using a composite substrate and an opposing substrate which has thereon an electrode and which is bonded to the composite substrate at a predetermined gap therefrom. An electro-optical material, such as a liquid crystal compound, is confined within the gap. The composite substrate includes a single crystal layer of a semiconductor material provided on a lower level insulation layer. The single crystal layer is formed with a source region, a drain region, and a channel region of a MOS transistor, and a gate insulation film is provided on the single crystal layer in alignment with the channel region. Further, a gate electrode is provided on the gate insulation film. The composite substrate further includes a pixel electrode on the upper major surface of an insulation layer deposited over the MOS transistor and in contact with the drain region. The single crystal semiconductor thin film is limited to 0.3 microns in thickness resulting in a light valve characterized in that a parasitic channel and a bipolar action in the MOS transistor are eliminated for the purpose of suppressing an increase in the OFF current, or leakage current caused by incident light radiation onto the transistors.

19 Claims, 13 Drawing Sheets

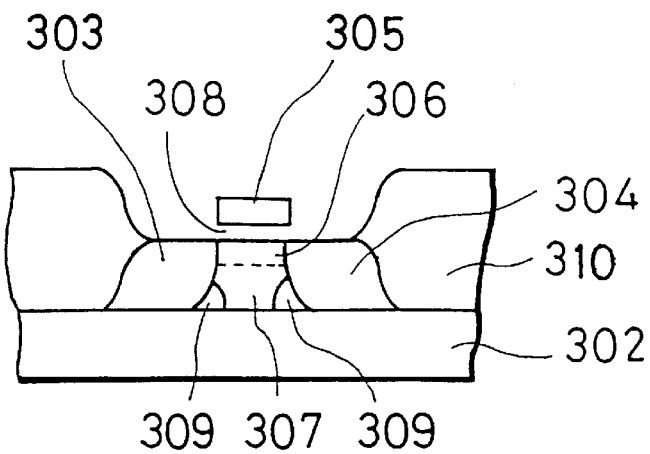
FIG. 14
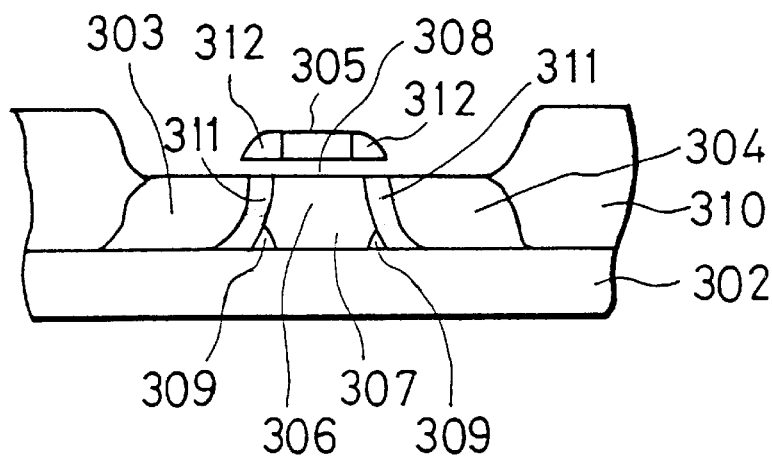
FIG. 15
FIG. 16
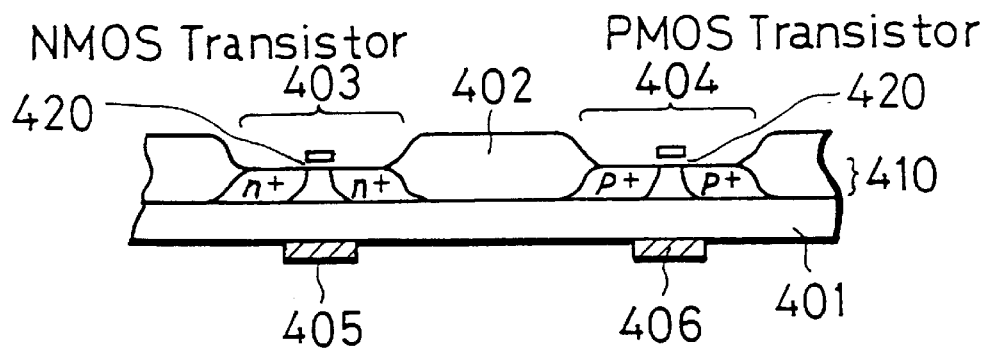

LIGHT VALVE HAVING A SEMICONDUCTOR FILM AND A FABRICATION PROCESS THEREOF

BACKGROUND OF THE INVENTION

The present invention generally relates to light valves having a liquid crystal layer confined between a pair of substrates, and more particularly to a light valve of the foregoing type with carrying MOS transistors having a single crystal semiconductive channel forming region provided on a semiconductor layer as switching elements for selectively applying a voltage signal to the liquid crystal layer to activate individual picture elements.

Conventionally, light valves of the active matrix type LCD are known. In the light valve of the foregoing type, thin film transistors are formed on an amorphous or polycrystal silicon layer that is deposited on a glass substrate, for individually switching liquid crystal pixels. As an amorphous silicon layer or polysilicon layer can be deposited easily on a glass substrate by a CVD process, the active matrix type LCD having the foregoing construction is suitable for realizing a light valve having a large display area.

On the other hand, the conventional light valves that use an amorphous silicon or polysilicon layer have a drawback in that miniaturization of transistor elements and increase of the integration density is difficult, although such a device is suitable for constructing a large area LCD device of the direct-view type. These problems have made it impossible to produce a high resolution transmissive type or projection type, displays, such as a light valve.

In order to overcome the foregoing problem associated with the light valves that use an amorphous silicon or polysilicon layer, a light valve was proposed recently that uses a single crystal semiconductor layer formed on a carrier layer of an insulating material. In the foregoing device, a number of MOS transistors are provided on the single crystal semiconductor layer as switching transistor elements. When a single crystal layer of silicon is used for the single crystal semiconductor layer, one can achieve an improved operational speed together with an increased integration density for the switching transistor elements.

FIG. 4 shows a cross section of a composite semiconductor substrate wherein a single crystal semiconductor layer is provided on a carrier layer. In FIG. 4, elements such as the liquid crystal layer, the substrates opposing each other across the liquid crystal layer, the polarizers provided adjacent to the substrates, and the like, are omitted from the illustration.

Referring to FIG. 4, it will be noted that a single crystal semiconductor layer 25 as well as a device isolation region 32 are formed on an insulation layer 31 that is provided on a carrier layer 29 of an insulating material, with a bonding layer 30 interposed between the layers 29 and 31. In the single crystal semiconductor layer 25, a source region 21 and a drain region 22 are formed by doping an impurity element, and a gate insulation layer 26 covers the upper surface of the layer 25. Further, a gate electrode 24 is provided on the gate insulation film 26. Thereby, the source region 21, the drain region 22, the gate insulation film 26 and the gate electrode 24 form a MOS switching transistor element 20. Further, in correspondence to the source region and the drain region, a drain electrode is provided such that the drain electrode acts as a source electrode 27 as well as a pixel electrode 28. Further, the entire structure is buried under an insulation layer 33, and a semiconductor composite substrate having a planarized surface is formed. Typically, silicon oxide is used for the insulation layer 31 while a single crystal, or monocrystalline, silicon is used for the single crystal semiconductor layer 25.

In the light valve having the foregoing construction for the switching transistor elements, however, there occurs a problem in that OFF leakage currents tend to increase in the MOS transistor made of a signal crystal semiconductor when light irradiates the transistor, which problem does not exist in a transistor made of a poly or amorphous semiconductor material.

SUMMARY OF THE INVENTION

The principal object of the present invention is to eliminate the problem of unwanted parasitic channel formation in the single crystal semiconductive channel forming region along the interface with the insulation layer that is opposite the interface where the proper channel is formed and to eliminate the problem of a bipolar action in MOS transistor, when a light irradiates onto the transistor.

In order to achieve the foregoing object and others, the present invention provides in one aspect a light valve having a composite semiconductor substrate and MOS transistors provided on a semiconductor layer that forms part of the composite semiconductor substrate, wherein the semiconductor layer is doped with an impurity element such that the semiconductor layer has a reduced impurity concentration level in a single crystal semiconductive channel forming region of the MOS transistors as compared with the non-channel forming regions of the semiconductor layer. According to this aspect of the present invention, the problem of the increase in OFF leakage current under light irradiation is effectively eliminated.

In order to achieve the object, the present invention provides in another aspect a light valve having a composite semiconductor substrate and MOS transistors provided on a single crystal semiconductor layer that forms part of the composite semiconductor substrate, wherein the single crystal semiconductor layer is doped by a first impurity element having a first conductivity type to a sufficient level such that the formation of the parasitic channel and bipolar action under light irradiation are suppressed and wherein the single crystal semiconductor layer is doped by a second, different impurity element having a second, opposite conductivity type in a region wherein the channel of the MOS transistor is to be formed, with an impurity concentration level such that the MOS transistor has a desired threshold voltage.

In order to achieve the object, the present invention provides in yet another aspect a light valve having a composite semiconductor substrate and MOS transistors provided on a single crystal semiconductor layer that forms a part of the composite semiconductor substrate, wherein a region having an increased impurity concentration level is formed in the single crystal semiconductor layer at a location adjacent to a source region and a drain region of the MOS transistors, with a conductivity type that is opposite to the conductivity type of the source and the drain regions. According to this aspect of the present invention, formation of an inversion region is suppressed in the regions adjacent to the source and drain regions wherein the impurity concentration level is increased, even when an inversion layer is formed at the interface between the insulation layer and the single crystal semiconductor layer. Thereby, the inversion layer is electrically isolated from the source region as well as from the drain region and formation of the parasitic channel and the bipolar action when a light irradiates the composite substrate are substantially eliminated. As a result, the operation of the MOS transistors is significantly stabilized.

In order to achieve the aforementioned objects, the present invention provides in still another aspect a light valve having a composite semiconductor substrate and MOS transistors provided on a single crystal semiconductor layer that forms a part of the composite semiconductor substrate, wherein a gate electrode is provided on an insulation layer located adjacent to the single crystal semiconductor layer on a side opposite to the side on which the gate electrode is provided, the gate electrode being provided in correspondence to the channel region of the MOS transistors, such that a voltage is applied to the foregoing electrode. By applying a control voltage to the foregoing electrode, formation of the parasitic channel and the bipolar action are suppressed.

Still yet in accordance with another aspect of the present invention, the thickness of the semiconductor layer that forms part of the composite substrate is not greater than 3 $\mu$m, or alternatively, the distance between the source region and the drain region of the MOS type transistor is not more than 1 $\mu$m.

In the present invention, as another means adopted to achieve the foregoing object, a region for carrier recombination is provided at other than a channel formation region of a single crystal semiconductor thin film layer, thereby the change in the substrate electric potential is suppressed even during light radiation. Thereby the occurrence of the OFF leak current and the fluctuation in the threshold voltage in a transistor have been prevented.

Other objects and further features and advantages of the present invention will become apparent from the following detailed description when read in conjunction with the attache drawings.

BRIEF DESCRIPTION OF THE DRAWINGS

FIG. 14 is a cross sectional diagram showing schematically another embodiment of the MOS transistor constructed on the composite substrate for use in the light valve of the present invention, wherein the MOS transistor has a doped region formed between the source region and the drain region with a conductivity type opposite to the conductivity type of the source and drain regions, with an increased impurity concentration level in correspondence to the foregoing doped region;

FIG. 15 is a cross sectional diagram showing schematically a MOS transistor constructed on the composite substrate for use in the light valve of the present invention wherein the MOS transistor has a structure of a high withstand voltage MOS transistor;

FIG. 16 is a cross sectional diagram showing schematically another embodiment of the MOS transistor constructed on the composite substrate for use in the light valve of the present invention, wherein the MOS transistor includes an electrode provided at the lower surface of an insulation layer in correspondence to the channel region for eliminating the backchannel effect;

DETAILED DESCRIPTION OF THE PREFERRED EMBODIMENTS

Prior to explanation of the preferred embodiments, the OFF leak current generation mechanism due to incident light radiation in the MOS type transistor of the single crystal semiconductor has been elucidated, and will be explained hereinafter in greater detail with reference to the n-channel MOS type transistor as an example.

Figure 5:
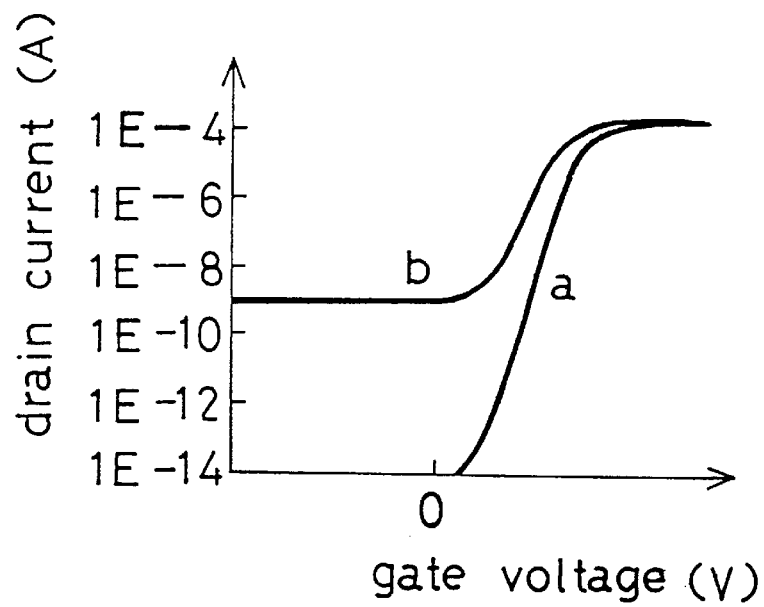
FIG. 5 is an illustrative view showing the change in the drain current—gate voltage characteristics of the n-channel MOS type transistor depending on the presence or absence of light radiation.

FIG. 5 is an illustrative view showing the change in the drain current—gate voltage characteristics of the n-channel MOS type transistor depending on the presence or absence of incident light radiation.

When the light is not irradiated, the OFF leak current of the MOS type transistor is extremely small as in curve (a), causing no trouble in the operation of the transistor.

However, when the light is irradiated, the threshold voltage of the MOS type transistor decreases as in curve (b), and the OFF leak current also increases. The fact that the threshold voltage increases indicates that the electric potential in the internal region other than the channel region, the source region and the drain region of the MOS type transistor increases.

Figure 6:
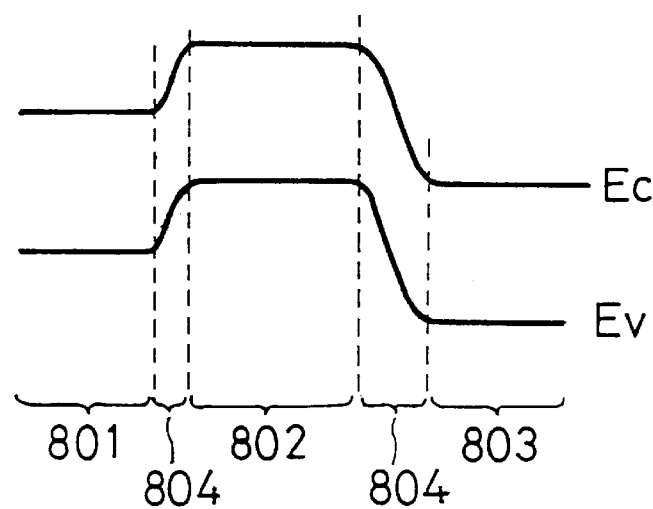
FIG. 6 is an illustrative view showing the energy band over the source region—internal region—drain region of the n-channel MOS type transistor in a state of no light radiation.

FIG. 6 is an illustrative view showing the energy band over the source region—internal region—drain region of the n-channel MOS type transistor in a state of no light radiation. It shows a state in which a constant positive voltage is applied to the drain region 803.

When the light is irradiated onto the transistor in this state, a large number of electrons and positive holes are generated mainly in a depletion layer region 804 due to the energy of light. The amount of the incident generation increases in accordance with the intensity of incident light. According to experiments performed by the present inventors, the relation between the light illuminance (1x) of white light and the OFF leak current of the MOS transistor is linear (proportional.

Figure 7:
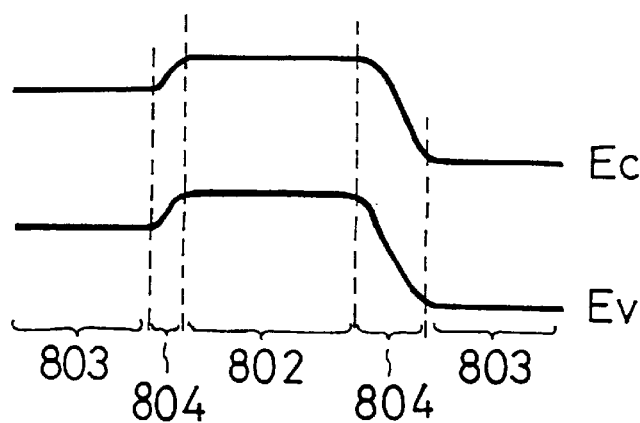
FIG. 7 is an illustrative view showing the energy band over the source region—internal region—drain region of the channel MOS type transistor in a state of light radiation.

Among the electrons and the positive holes having been generated, the electrons enter the drain region 803 and the source region 801 in accordance with the gradient of the energy band, but the positive holes are accumulated in the internal region 802. Then the electric potential in the internal region 802 increases, resulting in the energy band structure as shown in FIG. 7.

Because of the increase in the electric potential in the internal region 802, the threshold voltage of the n-channel MOS type transistor decreases. In addition, in the vicinity of an interface between the underlying insulation film 102 and the internal region 120 in the embodiments of the light valve according to the present invention shown in FIG. 1 to FIG. 3, the parasitic channel is subject to occur.

Further, when the electric potential in the internal region 802 increases, bipolar action occurs using as a trigger the light radiation in which a large amount of electrons flow from the source region 801 into the drain region 803. This bipolar action occurs by allowing the electrons to diffuse in the internal region 802 from the source region 801 and arrive at the drain region 803, so that the shorter the distance between the source region 801 and the drain region 803 for such diffusion, the more easily the electrons survive, and when the distance between the source region 801 and the drain region 803 is not more than 1 $\mu$m, the occurrence takes place extremely easily.

This phenomenon is inherent in the MOS type transistor of the single crystal semiconductor, which occurs due to the excellence in the crystallinity of the internal region 802. In the MOS type transistor of the polycrystal or amorphous semiconductor, because the electrons easily recombine in the internal region 802 and disappear, this phenomenon does not occur. Due to the foregoing mechanism, the incident light radiation increases the OFF leak current of the MOS type transistor of the single crystal semiconductor. The explanation has been made hereinbefore using the n-channel MOS type transistor as an example. However, in the case of a p-channel MOS type transistor, the electric potential in the internal region decreases due to light radiation to allow the positive holes to flow, as the carrier is different from the case of the n-channel, and the OFF leak increases in accordance with a similar mechanism.

In addition, it has been mentioned that the OFF leak current of the MOS type transistor of the single crystal semiconductor due to incident light radiation relates to the film thickness of a semiconductor layer forming the MOS type transistor, which will be described hereinafter.

Figure 8:
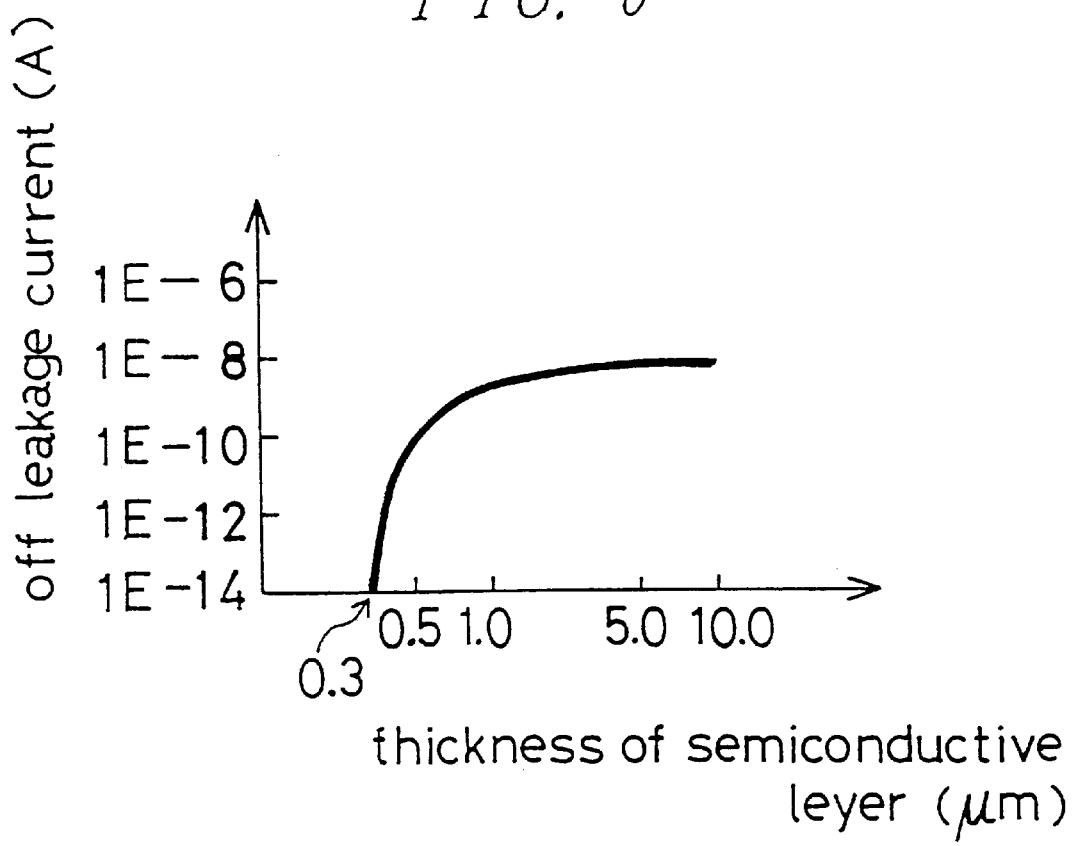
FIG. 8 is a figure showing the relation between the OFF leak current and the semiconductor layer film thickness during light radiation onto the n-channel MOS type transistor having a channel length of 2 $\mu$m and a channel width of 20 $\mu$m.

As one example, when the semiconductor layer for forming the MOS type transistor is the single crystal semiconductor of the present application, the relationship between the OFF leak current during light radiation of the n-channel MOS type transistor having a channel length of 2 $\mu$m and a channel width of 20 $\mu$m and the semiconductor layer film thickness is shown in FIG. 8.

As shown in FIG. 8, it is understood that in a region of the semiconductor layer film thickness of not less than 0.3 $\mu$m, an OFF leak current is generated by incident light radiation, while in the case of a film thickness of not less than the above, the value of the OFF leak current rapidly increases. On the other hand, when the semiconductor layer film thickness is not more than 0.3 $\mu$m, the light transmits through the semiconductor layer, which gives no sufficient energy to generate carriers, so that there is generated no increase in the OFF leak current of the MOS type transistor due to the light radiation.

According to mechanism of increase in the OFF leak current of the MOS type transistor due to the light radiation as described above, it has been revealed that in order to suppress the increase in the OFF leak current during the light radiation, it is important to make the semiconductor layer into an adequately thin film, in order to prevent the electric potential fluctuation in the internal region 802 of the transistor shown in FIG. 6, and to thereby form a MOS type transistor structure which does not cause the parasitic channel and the bipolar action even when the electric potential is subjected to fluctuation.

For this purpose, there are hereafter described effective means for making the film thickness of the semiconductor layer for the MOS type transistor into not more than 0.3 $\mu$m, providing a region to immediately recombine and extinguish carriers generated by the light radiation, providing a sufficiently high threshold voltage of the parasitic channel even in the case of fluctuation in the electric potential in the internal region by setting an impurity concentration in the internal region to be high, and making it possible to ensure the integrity of the electric potential barrier between the source region and the internal region.

Next, embodiments of the light valve according to the present invention will be explained.

Figure 1:
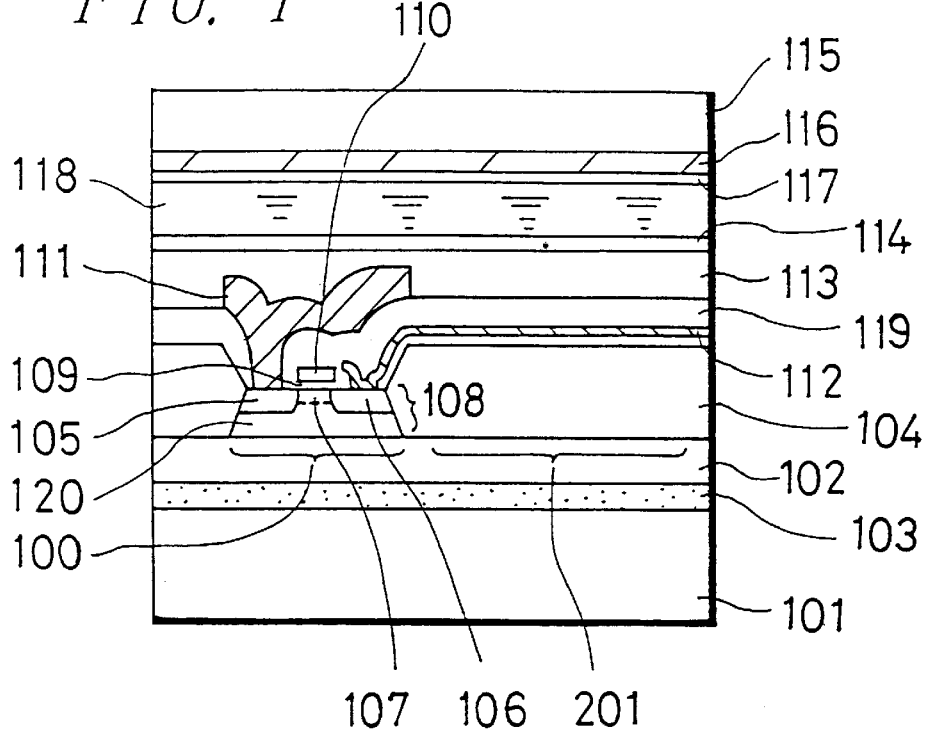
FIG. 1 is a cross sectional diagram showing schematically an embodiment of the light valve according to an embodiment of the present invention.

FIG. 1 shows schematically the cross sectional view of a light valve according to the present invention.

Referring to FIG. 1, a lowest level insulation layer 102 is bonded to a support substrate 101 by an adhesive layer 103 such that the support substrate 101 provides a rigid mechanical support to the insulation layer 102. Further, MOS transistor elements 100 each constructed on a single crystal semiconductor layer 108, are provided on the insulation layer 102 together with a device isolation region 104, wherein it will be noted that the MOS transistor is constructed on a single crystal semiconductor layer 108 in which a source region 105, a drain region 106 and a channel region 107 are formed. Further, a gate electrode 110 is provided on the semiconductor layer 108 in correspondence with the channel region 107, with a gate insulation film 109 interposed between the gate electrode 110 and the channel region 107. Further, an electrical connection is achieved in the illustrated structure between an interconnection electrode 111 and the source region 103 via a contact hole that is formed in an intermediate level insulation layer 119. There, the interconnection electrode 111 is formed to act also as a screen for preventing unwanted incident light from entering the single crystal semiconductor layer 108. Furthermore, in order to activate the electro-optical substance such as liquid crystal, a drive electrode 112 is provided on the device isolation layer 104, wherein the electrode 112 is connected electrically to the drain region 106 that is formed in the foregoing single crystal semiconductor layer 108. On the MOS transistor element 100, a protective layer 113 having a planarized upper major surface is provided such that the protective layer 113 buries thereunder the MOS transistor element 100 as well as the drive electrode 112 and the intermediate level insulation layer 119. When liquid crystal is used for the electro-optical substance, an alignment film 114 for aligning the orientation of the liquid crystal molecules is provided on the planarized upper major surface of the layer 113, and an opposing substrate 115 is provided to face the orientation membrane across a layer 118 of an electro-optical substance that is interposed therebetween. On the surface of the substrate 115 at the side facing the film 114, an electrode 116 is provided for applying a electric voltage to the electro-optical substance, and another alignment film 117 is provided on the electrode 116 such that the film 117 faces the film 114 across the liquid crystal layer 118.

There, the light valve of the present invention is assembled by mounting the opposing substrate 115 on the composite substrate on which the foregoing MOS transistors are formed, according to the foregoing relationship such that a gap is formed between the composite substrate and the opposing substrate 115. Further, the gap is filled by an electro-optical substance such as liquid crystal to form the electro-optical layer 118.

Figure 2:
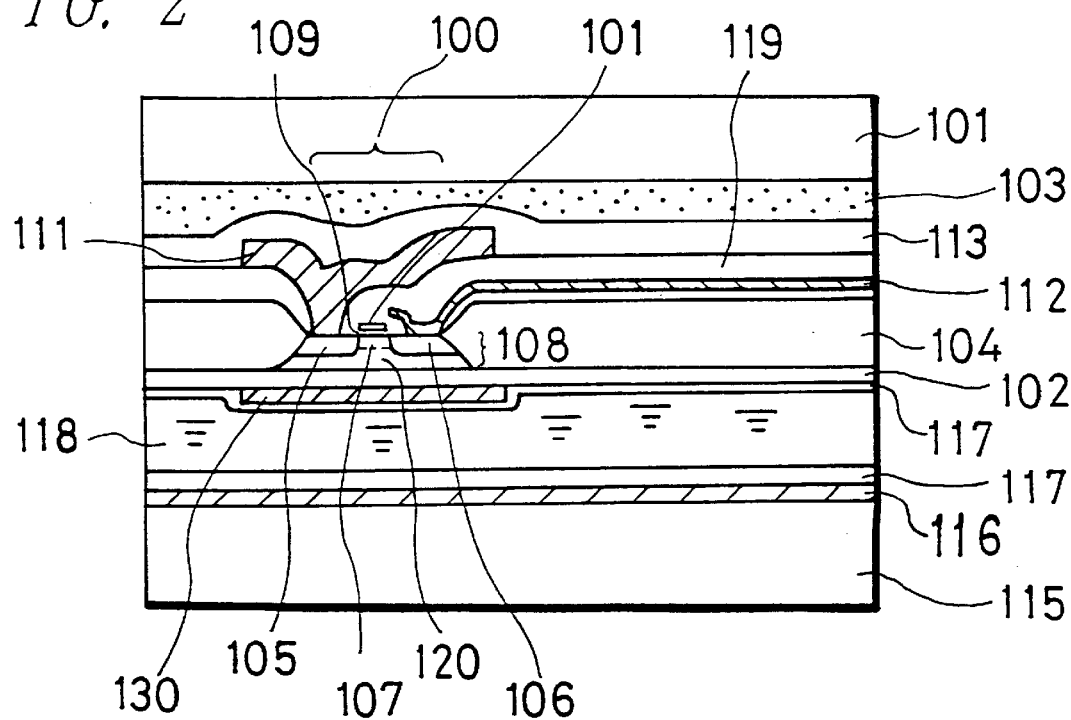
FIG. 2 is a cross sectional diagram showing schematically another embodiment of the light valve of the present invention.

FIG. 2 shows another embodiment of the light valve according to the present invention in a schematical cross sectional view.

Referring to FIG. 2, the light valve of the present embodiment includes a number of MOS transistor elements 100 and device isolation regions 104 both provided on the lower level insulation layer 102, wherein each MOS transistor element is constructed on the single crystal semiconductor layer 108 in which the source region 105, the drain region 106 and the channel region 107 are formed similarly to the previous embodiment. Further, the gate electrode 110 is provided on the single crystal semiconductor layer 108 in correspondence to the foregoing channel region, with the gate insulation film 109 interposed between the semiconductor layer 108 and the gate electrode 110. The source region 105 is connected electrically to the interconnection electrode 111 via a contact hole that is provided in the intermediate insulation layer 119, wherein the interconnection electrode 111 is shaped to interrupt the incidence of external light into the single crystal semiconductor layer 108. On the device isolation layer 104, the drive electrode 112 for driving the electro-optical substance such as liquid crystal is provided such that the drive electrode 112 is connected electrically to the drain region 106 in the semiconductor layer 108. Further, the foregoing MOS transistor element 100, the drive electrode 112 and the intermediate level insulation layer 119 are buried under the protective layer 113 similarly to the previous embodiment. In the present embodiment, on the other hand, the upper major surface of the protective layer 113 is bonded to the lower major surface of the substrate 101 via the adhesive layer 103. Further, a shade 130 is provided on the lower major surface of the lower level insulation layer 102 such that incidence of light into the MOS transistor is prevented from the channel region 107 thereof. When liquid crystal is used for the electro-optical substance, the alignment film 117a is provided on the lower major surface of the insulation layer 102 including the lower major surface of the shade pattern 130. Below the alignment film 117a, the substrate 115 is provided such that the substrate 115 carries the electrode 116 on the side facing the lower major surface of the layer 102 and hence the alignment film 114, for applying a drive voltage to the liquid crystal. Further, the other alignment film 117b is provided to cover the electrode 116 at the side that faces the alignment film 117a.

Thereby, the light valve is assembled by mounting the substrate 115 on the lower major surface of the insulation layer 102 that forms a part of the composite substrate, such that there is formed a gap between the insulation layer 102 and the substrate 115. After filling the gap by the electro-optical substance 118, the light valve of the present embodiment is completed.

Figure 3:
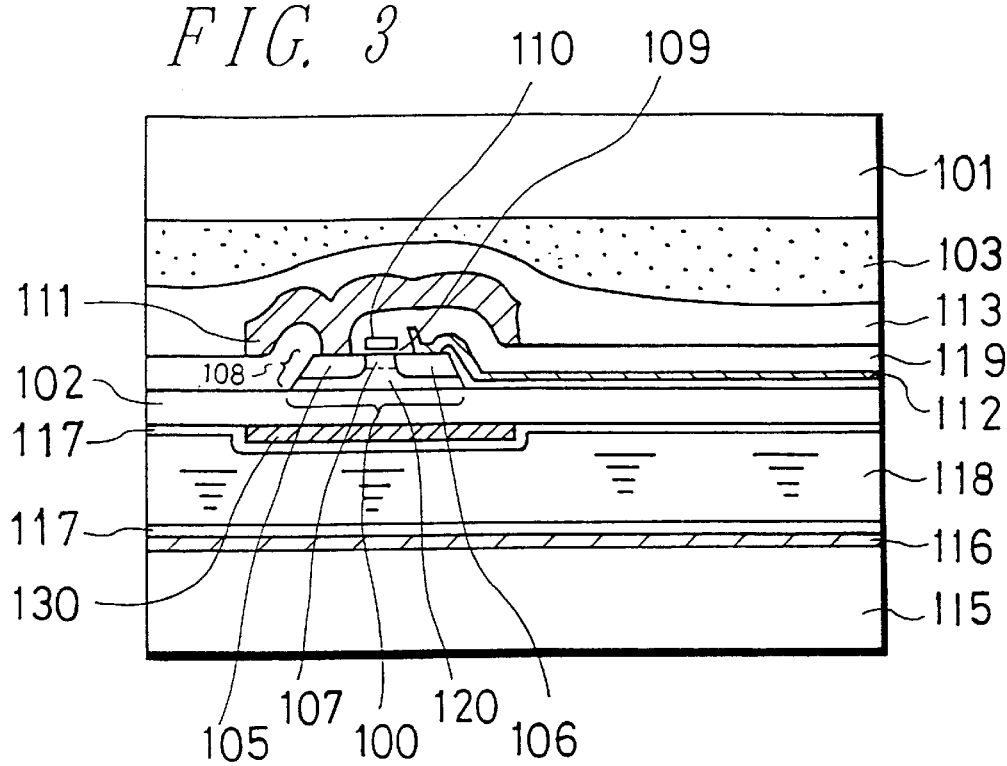
FIG. 3 is a cross sectional diagram showing schematically still another embodiment of the light valve of the present invention.
Figure 4:
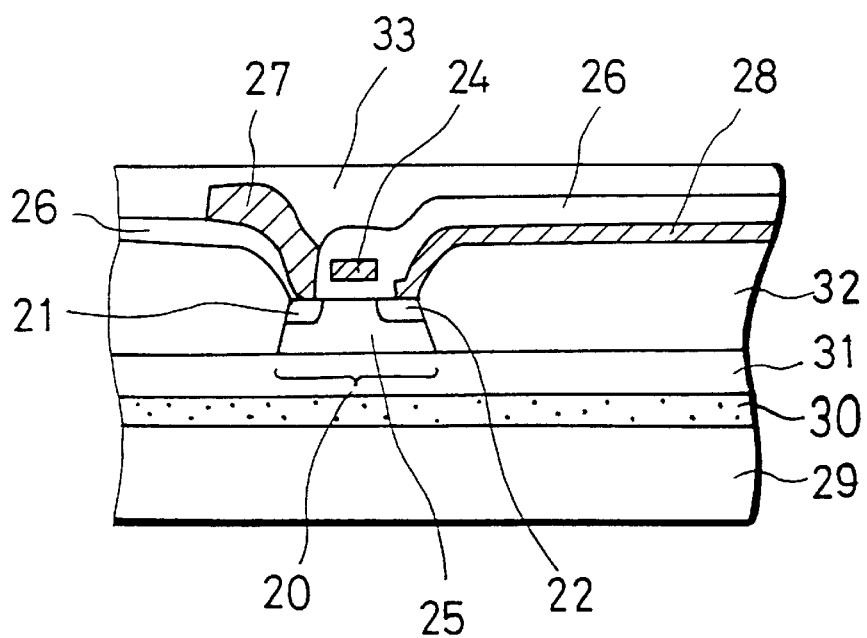
FIG. 4 is a cross sectional diagram showing schematically the structure of a conventional composite semiconductor substrate for use in a light valve wherein the composite substrate includes a single crystal semiconductor layer.

FIG. 3 shows another embodiment of the light valve according to the present invention.

Referring to FIG. 3, it will be noted that the light valve of the present embodiment is distinguished over the light valve of the preceding embodiments in the point that the device isolation is achieved by removing the single crystal semiconductor layer 108 in correspondence to the device isolation region by an etching process. By constructing the device as such, one can reduce the distance between the drive electrode 112 and the electro-optical substance 118 as compared with the embodiment of FIG. 2, and the driving of the electro-optical substance can be achieved at a reduced drive voltage. The rest of the features of the present embodiment are substantially identical with the embodiment of FIG. 2. Generally, the light valve of the type discussed uses liquid crystal for the electro-optical substance. When liquid crystal is used, polarizers are disposed at the respective upper and lower major surfaces of the substrates 101 and 115 for causing the desired visual effect in the light beam that exits from the light valve. The illustration of such polarizers is omitted for the sake of simplicity. Further, it should be noted that, preferably, the channel region 107 in the single crystal semiconductor layer 108 is formed with a reduced impurity concentration level as compared with the internal region 120 except for source and drain regions 105 and 106 with contrary to a structure of a prior MOS transistor, in which the channel region 107 is formed with the same or a higher impurity concentration level than the internal region 120.

In other words, since the impurity concentration in the internal region 120 is high, even when the electric potential in the internal region 120 is subjected to fluctuation due to the carrier generated by light, it is difficult to generate the parasitic channel. In addition, the height of the electric potential barrier between the source region 105 and the internal region 120 is high as compared with the MOS type transistor of the conventional structure, so that it is difficult to generate the bipolar action. Further, the lifetime of the carrier in the internal region 120 also becomes short, so that it becomes more difficult to generate the bipolar action.

Figure 9:
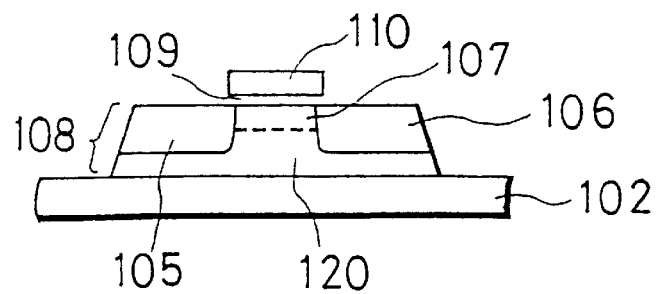
FIG. 9 is a cross sectional view showing an embodiment of the MOS transistor constructed on a composite substrate and used in the light valve of the present invention.

FIG. 9 shows schematically the structure of the MOS transistor used in the light valves of FIGS. 1–3, wherein the structural elements are designated by the same reference numerals. Referring to FIG. 9, the lower level insulation layer 102 is formed of silicon oxide. Further, the single crystal semiconductor layer 108 is formed of a single crystal layer of silicon. Thus, the MOS transistors used in the light valve of FIGS. 1–3 have the structure so-called SOI (silicon-on-insulator). Further, the MOS transistor has the channel region 107 such that the impurity concentration level of the region 107 is set smaller than the internal region 120, similar to the MOS transistors of FIGS. 1–3.

When fabricating the MOS transistor in the form of an n-channel MOS transistor, an impurity element having a conductivity type opposite to the conductivity type of the source and the drain regions such as boron (B) is introduced with an increased concentration level, and the impurity element thus introduced is subjected to a thermal diffusion process. In the case where a silicon single crystal is used for the single crystal semiconductor layer 108, in combination with B that acts as a p-type dopant, there is a tendency that the concentration of B decreases significantly at the interface between the silicon oxide insulation layer 102 and the silicon single crystal layer 108, and such a decrease at the interface induces an inversion layer in the silicon single crystal layer 108 in correspondence with the interface thereof with the lower level insulation layer 102. Thereby, the risk that the parasitic channel under incident light irradiation being formed increases substantially. In order to prevent the formation of the parasitic channel at the low threshold voltage and also the bipolar action, the present invention introduces an impurity element at a high concentration level in advance, and then another impurity element having the same conductivity type as the source and the drain regions, is introduced into the surface of the silicon single crystal layer 108 including the channel region 107. Thereby, one can dope the channel region 107 with a concentration level smaller than the concentration level inside the internal region 120.

Further, optionally, the channel region 107 may be allowed to have a conductivity type which is the same as that of the source and drain regions. In addition, as an alternative process, in accordance with the ion implantation process, when the implantation energy is suitably set, boron is subjected to deep ion implantation, and the internal region 120 is allowed to have an impurity concentration distribution which is sufficiently higher than that of the channel formation region 107, then it is also possible to omit the counter dope step as just described.

Figure 10:
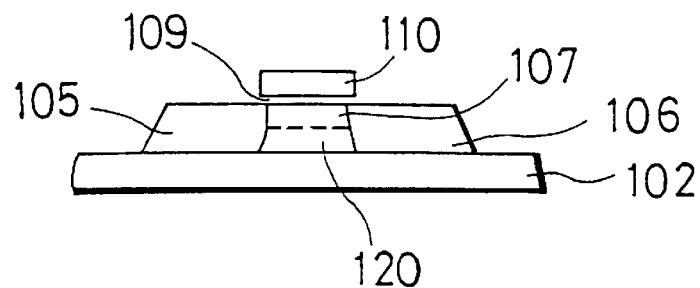
FIG. 10 is a cross sectional diagram showing schematically another embodiment of the MOS transistor that is constructed on the composite substrate and is used in the light valve of the present invention, the MOS transistor having source and drain regions formed to contact to an insulation layer located underneath a single crystal semiconductor layer on which the MOS transistor is formed.

FIG. 10 shows the schematical cross section of the composite substrate used in the light valve of the present invention, wherein FIG. 10 shows various structural elements with the same reference numerals as in FIG. 9. The difference that distinguishes the structure of FIG. 10 over the structure of FIG. 9 exists in the point that the source region 105 and the drain region 106 extend in the downward direction and contact the lower level insulation layer 102 of silicon oxide. By constructing the MOS transistor as such, it is possible to reduce the parasitic capacitance associated with the source and drain regions, and the operational speed of the transistor element increases. As the rest of the structure of FIG. 10 is substantially identical with FIG. 9, further description will be omitted.

Figure 11A:
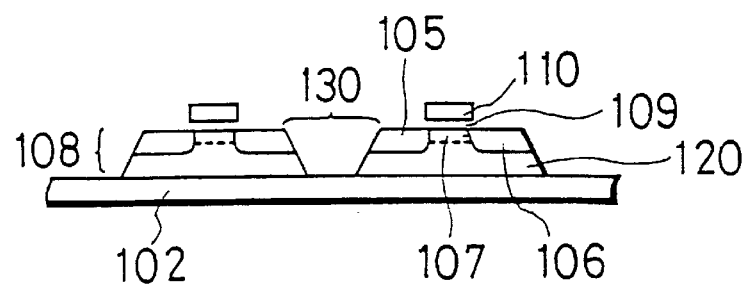
FIGS. 11(a) and 11(b) are cross sectional diagrams showing schematically another embodiment, particularly the device isolation region, of the MOS transistor that is constructed on the composite substrate and is used in the light valve of the present invention.
Figure 11B:
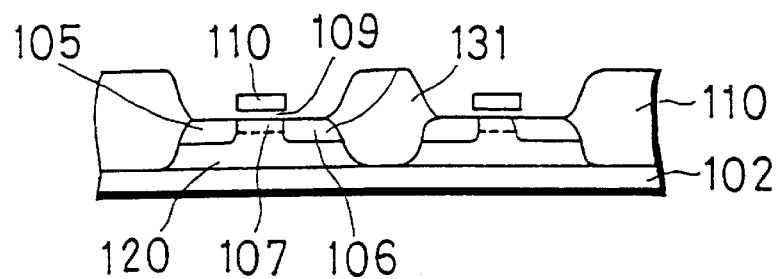

FIGS. 11(a) and 11(b) show another embodiment of the composite substrate that is used in the light valve of the present invention, in a schematical cross sectional view. Particularly, these drawings illustrate the structure of the device isolation region of the MOS transistor. More particularly, FIG. 11(a) shows an example wherein the device isolation region 130 is formed by removing a part of the single crystal semiconductor layer 108 forming the device layer, while FIG. 11(b) shows an example wherein a device isolation region 131 is formed in the single crystal silicon layer 108 by a selective oxidation process. The rest of the structure is substantially identical with the embodiment of FIG. 9.

As described previously, the MOS transistor of the SOI type constructed on the underlying insulation layer 102 has the impurity concentration level set smaller in the channel region as compared with the interior region 120 of the semiconductor layer. Thereby, formation of the parasitic channel and the bipolar action under light irradiation are effectively eliminated and the operation of the transistor substantially stabilized.

FIG. 12(a)–12(d) show another embodiment of the n-channel MOS transistor for use in the light valve of the present invention together with the fabrication process thereof, wherein the MOS transistor is constructed on a composite substrate.

Referring to FIG. 12(d) first, it will be noted that an n-channel MOS transistor is formed in a p-type device layer 212 acting as a semiconductor layer of a first conductivity type that in turn is provided on a silicon oxide layer 202 forming an insulating substrate. Further, a source region 208 and a drain region 209 both doped to the n-type conductivity, are provided as an impurity region of the second conductivity type, such that both of the source region 208 and the drain region 209 contact the silicon oxide layer 202. The device layer 212 includes therein an internal device region 210 that is doped by a p-type dopant with a concentration level sufficient for eliminating the backchannel at the interface 213 between the internal device region 210 and the silicon oxide layer 202. Typically, the region 210 is doped to a level of $1 \times 10^{17}$ cm$^{-3}$. Further, there is formed a channel region 206 to extend along the upper major surface of the internal device region 210 between the source region 208 and the drain region 209, wherein the channel region 206 is doped additionally by an n-type dopant such that the effective concentration level of the p-type dopant is reduced in the channel region 206. By doping the channel region 206 as such, one can compensate for the increase of the threshold voltage of the channel region 206 that is caused as a result of the increased impurity concentration level of the internal device region 210. Further, if it is necessary, the channel region 206 can be made of n-type semiconductor having low impurity concentration. In the n-channel MOS transistor of the present invention, although the increased impurity concentration level of the internal device region 210 in correspondence to the part other than the channel region 206, causes a problem of increased capacitance at the interface between the internal device region 210 and the bottom region of the source region 208 or the drain region 209, such an increase in the capacitance is much smaller than the corresponding increase of the capacitance that occurs in the usual semiconductor substrate. It should be noted that the source region 208 and the drain region 209 contact with the silicon oxide layer 202. Thereby, the problem of the decrease of the operational speed of the transistor is minimized.

Next, the fabrication process of the n-channel MOS transistor according to the present invention will be described.

Referring to FIG. 12(a), an SOI substrate is prepared such that the substrate includes a support substrate 201 on which a device layer 203 of a silicon single crystal is provided with a thickness of less than 1 μm, with an intervening silicon oxide layer 202 interposed between the support substrate 201 and the device layer 203. Further, the device layer 203, on which the n-channel MOS transistor is to be formed, is doped to the p-type conductivity by incorporating a p-type dopant by an ion implantation process, and the like, with a sufficient concentration level for eliminating the formation of the backchannel. For example, the dopant is introduced with a concentration level of $1 \times 10$ cm$^{-3}$. The dopant thus introduced is activated by applying a diffusion process subsequently. Thereafter, a thermal annealing process is applied such that the p-type dopant distributes generally uniformly over the device layer 203 of the single crystal silicon. When boron is subjected to the heat treatment in an oxidation atmosphere, the concentration decrease is caused due to segregation at the interface between the single crystal silicon device layer 203 and the silicon oxidation film 202, so that heat treatment in a nitrogen atmosphere is preferable.

Next, the device layer 203 thus formed is applied by an etching process as shown in FIG. 12(b) such that a pedestal region 204 is formed with a separation from each other for device isolation. Although not illustrated, such device isolation can be achieved by the conventional LOCOS process. Further, the foregoing doping process of the layer 203 may be achieved after the pedestal region 204 is patterned.

Next, as shown in FIG. 12(c), a gate insulation film 205 is formed by a thermal oxidation process or CVD process, and an ion implantation of an n-type dopant is conducted in correspondence to the surface part of the region 204 where the p-type dopant is already introduced, for controlling the threshold control. Thereby, the channel region 206 is formed in the surface of the region 204 wherein the effective concentration level of the p-channel dopant is reduced. For the n-type dopant, a dopant such as arsenic having a small diffusion coefficient is preferred. Of course, one can use phosphorus or antimony (Sb) when appropriate.

Figure 12:
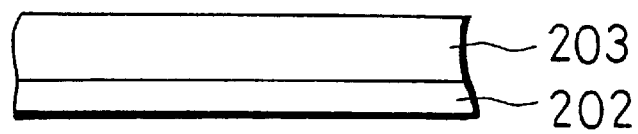
FIGS. 12(a)–12(d) are cross sectional diagrams showing schematically the structure of another embodiment of the MOS transistor that is constructed on the composite substrate and is used in the light valve of the present invention, together with the step-by-step fabrication process for fabricating the MOS transistor.
Figure 12:
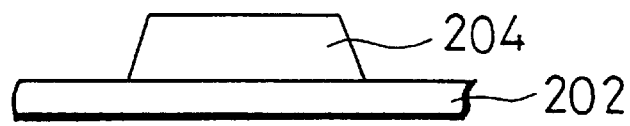
Figure 12:
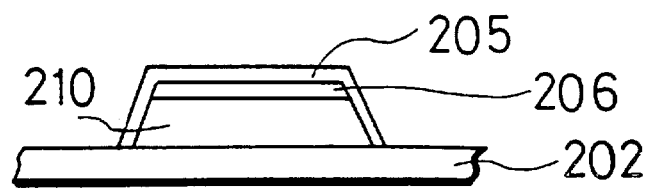
Figure 12:
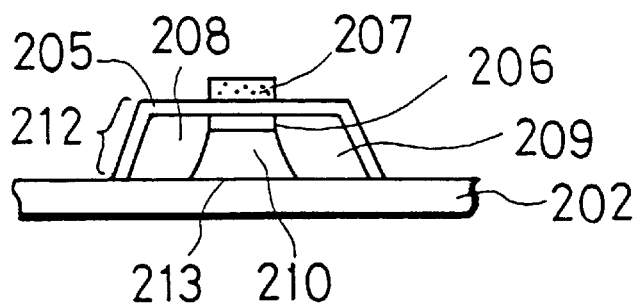

Next, as shown in FIG. 12 (d), a gate electrode 207 is formed according to the commonly practiced process, and the source region 208 and the drain region 209 are formed at both lateral sides of the gate electrode 207 by an ion implantation process such that the regions 208 and 209 contact with the silicon oxide layer 202. Thereby, the fabrication of the n-channel MOS transistor is completed.

Figure 13:
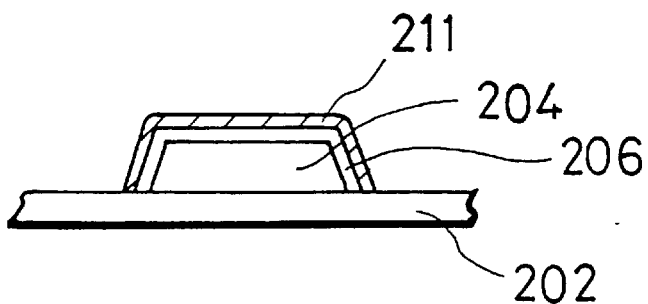
FIG. 13 is a cross sectional diagram showing schematically another embodiment for fabricating the composite substrate for use in the light valve of the present invention.

FIG. 13 shows another embodiment for fabricating the semiconductor device of the present invention schematically.

FIG. 13 shows a step that is conducted after the steps of FIGS. 12(a) and 12(b), wherein a layer 211 containing an n-type dopant is formed to cover the region 204, and the channel region 206 is formed as a result of the diffusion of the n-type dopant from the n-type region 211. After the step of FIG. 13, the layer 211 is removed by an etching step not illustrated, and the gate insulation layer 205 is provided in place of the layer 211. After this, a series of conventional fabrication processes are conducted to form the n-channel MOS transistor shown in FIG. 12(d).

In the foregoing description, the present invention has been described with reference to an n-channel MOS transistor. However, the present invention can be applicable also to the p-channel MOS transistor by merely inverting the dopant conductivity type.

As described above with reference to FIGS. 12 and 13, one can set the impurity concentration level of the first conductivity type dopants to be smaller in the channel region 206 as compared with the internal device region 210 as a result of the counter doping effect achieved by the second conductivity type dopant in the channel region 206 of the MOS transistor. Further, the internal device region 210 is doped by the first conductivity type dopant to a sufficiently high concentration level such that the inversion does not occur easily. Thereby, the problems due to formation of the parasitic channel and the bipolar action under incident light irradiation in the first conductivity type device region of the MOS transistor constructed on the SOI substrate are successfully eliminated. According to the foregoing embodiments, one can achieve a desired control of the threshold voltage of the transistor while simultaneously suppressing an OFF leakage current in the MOS transistor under light irradiation. Further, it should be noted that the MOS transistor described heretofore can be fabricated according to conventional fabrication process techniques of integrated circuit production, and use of particularly designed fabrication system is not required. Thus, the MOS transistor can be mass fabricated without extra investment. The composite substrate that carries the MOS transistor thus formed is used in any of the light valves described with reference to FIGS. 1–3. Thereby, formation of the parasitic channel is effectively eliminated even when the MOS transistor is subjected to an incident optical irradiation, and a stable operation is achieved for the light valve.

As described above, the source region and the drain region of the MOS type transistor explained in FIG. 9 to FIG. 13 contact with the internal region having a dense impurity concentration, so that there is a fear of generating a decrease in the junction voltage resistance, the occurrence of hot carriers and the like. In order to prevent the above, although not shown in the figure, it is effective to provide a so-called LDD or DDD structure in which a dilute impurity concentration region which has the same conductivity type as that of the drain region is provided at least between the drain region and the internal region.

FIG. 14 shows a schematical cross section of a MOS transistor according to another embodiment, wherein the MOS transistor is constructed also on a composite substrate and used for the light valve of the present invention. Referring to FIG. 14, the MOS transistor has a region of increased impurity concentration level between the source region and the drain region at the interface between the semiconductor layer in which the source and drain regions are formed and the underlying insulation layer. In the present embodiment, similarly to the case of FIG. 12 and FIG. 13 mentioned above, a silicon single crystal layer is used for the semiconductor layer and a silicon oxide layer is provided as the lower level insulation layer.

Referring to FIG. 14, the MOS transistor is constructed on a silicon oxide layer 302 that is provided on a silicon substrate 301 as an insulation layer. There, it will be noted that the MOS transistor has a gate electrode 305 provided on a gate insulation film 308 that covers an upper major surface of a single crystal silicon layer, and a channel region 306 is formed between a source region 303 and a drain region 304 provided in the single crystal silicon layer. Further, the device isolation is achieved by an device isolation region 310 located at both lateral sides of the single crystal silicon layer. In addition, it will be noted that a pair of regions 309 each having an increased impurity concentration level, are provided with a conductivity type opposite to the conductivity type of the source region 303 and the drain region 304. There, the regions 309 are provided in an internal region 307 located underneath the channel region 306 in contact with the source region 303 and the drain region 304. The foregoing region 309 of the increased impurity concentration level may be formed before the source and drain regions are formed, by applying an ion implantation process.

FIG. 15 is a diagram showing another embodiment of the MOS transistor constructed on the composite substrate for use in the light valve of the present invention, in a schematical cross sectional view, wherein the device of the present embodiment is distinguished from the device of FIG. 14 in that the device has the so-called LDD or DDD structure that is characterized by a high withstand voltage. More specifically, as shown in FIG. 14, since the junction voltage resistance decreases when the dense impurity concentration region 309 contacts with the source region 303 and the drain region 304, the device of FIG. 15 includes a lightly doped region 311 between the source and drain regions 303 and 304 such that the region 311 has the conductivity type as the source and drain regions 303 and 304. Generally, the gate electrode 305 is formed at first, and the region 311 is formed by applying an ion implantation process such that the region 311 is doped to a conductivity type that is identical with the conductivity type of the source and the drain regions. Next, a side spacer 312 is formed at both lateral sides of the gate electrode 305 by forming an insulation film in correspondence to the side spacer 312, and the source and drain regions 303 and 304 are formed by applying another ion implantation process. As the rest of the structure of the device of FIG. 15 is substantially identical with the structure of FIG. 14, further description will be omitted. In FIG. 15, it should be noted that those parts corresponding to the parts described with reference to FIG. 14 are designated by the same reference numerals.

In the embodiments of FIGS. 14 and 15, the MOS transistor has a high impurity concentrating region having a conductivity type opposite to the source and drain regions in correspondence to the lower part of the channel region in contact to the source and drain regions. Thereby, any inversion layer, induced along the interface to the lower level insulation layer 302 in correspondence to the application of a gate voltage that is smaller than a normal threshold voltage value while a light irradiates onto the interface, is prevented from reaching the source and drain regions 303 and 304 by the existence of the region 309 of the opposite conductivity type. Thereby, the parasitic channel effect is substantially eliminated and the bipolar action is effectively suppressed by carrier-recombination in the high impurity concentration region. It should be noted that the device isolation can be achieved by merely removing the silicon single crystal layer in the silicon oxide device isolation region 310.

As described above, the MOS transistor of FIGS. 14 and 15 includes a region of the increased impurity concentration level adjacent to the source and drain regions with a conductivity type opposite to the conductivity type of the source and drain regions. Thereby, the source region and the drain region are isolated from each other even when an inversion layer is formed in the vicinity of the interface to the underlying insulation layer. As a result, even when a light irradiates onto the MOS transistor, no substantial parasitic channel effect occurs and no bipolar action occurs and the MOS transistor operates properly and with high reliabillty, even when the device is used in the light valve of the present invention.

FIG. 16 is a schematical cross sectional diagram showing another embodiment of the MOS transistor that is provided on a composite substrate and is used for the light valve of the present invention. In the transistor of the illustrated embodiment, an off-leakage current is eliminated and an electrical potential fluctuation between the source region and the drain region is controlled by an electrode provided on a surface of the insulation layer below the single crystal semiconductor layer, wherein the electrode is provided on an opposing side of the insulation layer to the semiconductor layer. Hereinafter, the present embodiment will be described with reference to the embodiment of FIG. 16 that includes both an n-channel MOS transistor and a p-channel MOS transistor, wherein the n-channel MOS transistor and the p-channel MOS transistor are formed on an integrated circuit region that in turn is provided on a marginal part of the composite substrate of the light valve of the present invention. The integrated circuit region carries an integrated circuit for activating a matrix array that in turn controls the transmission of light through the light valve according to a desired image pattern. It will be noted that an n-channel MOS transistor 403 and a p-channel MOS transistor 404 are formed on a device layer 410 that in turn is provided on an insulation layer 401, with a mutual separation by a selective oxidation layer 402. Although not illustrated, each of the MOS transistors is interconnected by a conductor pattern to form the foregoing integrated circuit. Further, the n-channel MOS transistor 403 and the p-channel MOS transistor 404 have respective electrodes 405 and 406 underneath the insulation layer 401, wherein the electrode 405 is provided in correspondence or alignment, with the region between the source and the drain of the transistor 403 while the electrode 406 is provided in correspondence with the region between the source and the drain of the transistor 404.

Figure 17:
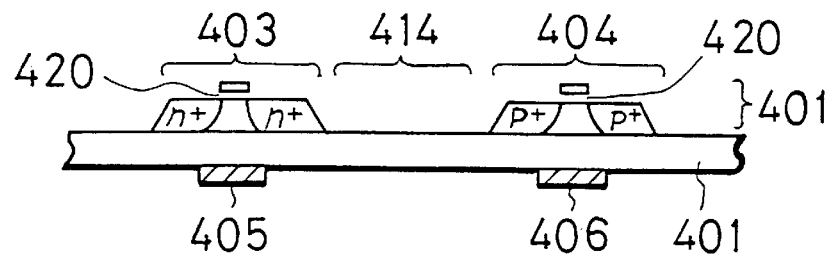
FIG. 17 is a cross sectional diagram showing schematically another embodiment of the MOS transistor constructed on the composite substrate for use in the light valve of the present invention.

FIG. 17 shows a schematical cross section of another embodiment of the composite substrate that is used for the light valve of the present invention. The structure of FIG. 17 is distinguished from the embodiment of FIG. 16 in that device isolation is achieved by a region 414 that is formed by etching of the device layer 410. It should be noted that the formation of the isolation region by etching is advantageous in view point of increasing the integration density as compared with the device isolation achieved by the selective oxidation. As other aspects of the present embodiment are substantially identical with the embodiment of FIG. 16, further description thereof will be omitted.

In the embodiments of FIGS. 16 and 17 that include the n-channel MOS transistor 403 and the p-channel MOS transistor 404 with respective electrodes 405 and 406 that can be activated independently, one can apply a voltage such as −20 volts to the n-channel MOS transistor and a voltage such as +20 volts to the p-channel MOS transistor. Thereby, even when a light irradiates onto the channel region, the electrical potential fluctuation between the source region and the drain region can be controlled, and the problem of formation of bipolar action can be effectively eliminated. Further, in the embodiments of FIGS. 16 and 17, one may provide the electrode 405 and the electrode 406 from a single electrode such that a common voltage level of −5 volts to −10 volts is applied to the common electrode. Even in such a case, the formation of the backchannel is eliminated due to the tendency of the p-channel MOS transistor wherein the formation of the parasitic channel is retarded.

With the foregoing construction, the overall operation of the integrated circuit is significantly stabilized. Further, the foregoing construction is applicable to the light valve of FIG. 2 or FIG. 3, wherein the effect for suppressing the formation of the backchannel can be enhanced further by providing the shade 130 by a conductive material such as aluminum (Al) or chromium (Cr) and by applying a voltage thereto as mentioned before. Thereby, the off-leakage current is effectively eliminated from the MOS transistor 100 that forms the matrix array of the light valve.

Figure 18:
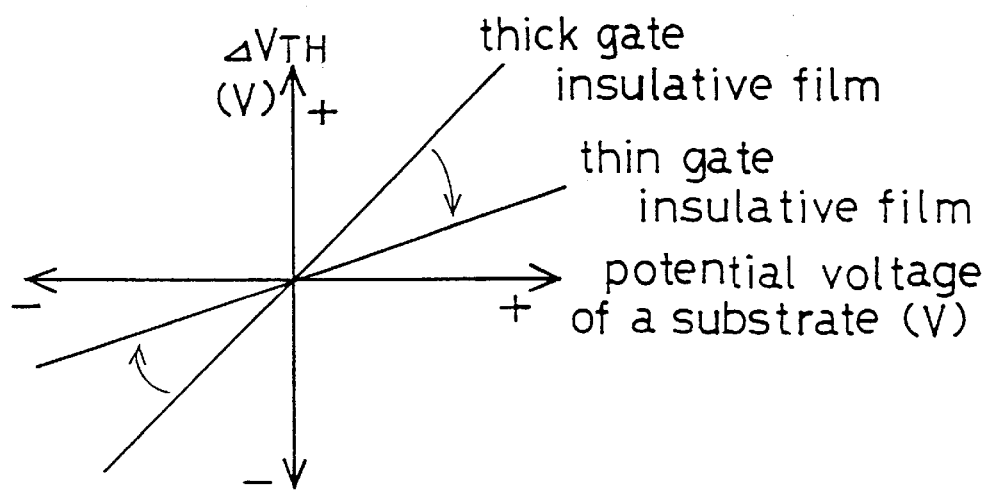
FIG. 18 is an illustrative view showing the relation between the threshold voltage fluctuation amount DVTH and the substrate electric potential in the MOS type transistor as using a parameter of the film thickness of the gate insulation film.
Figure 19:
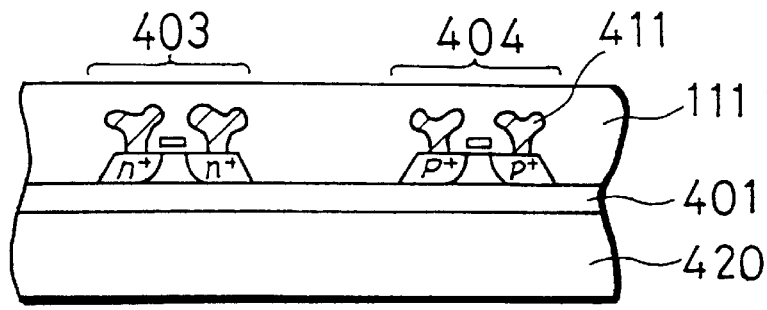
FIGS. 19(a)–19(d) are diagrams showing the process for fabricating the composite substrate including the MOS transistor of FIG. 17.
Figure 19:
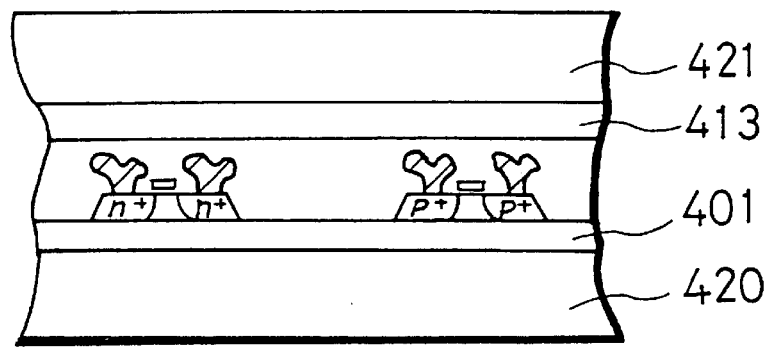
Figure 19:
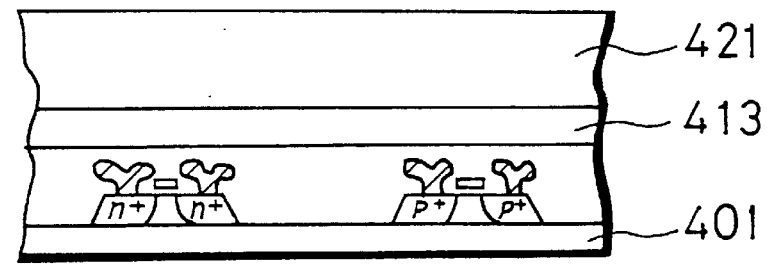
Figure 19:
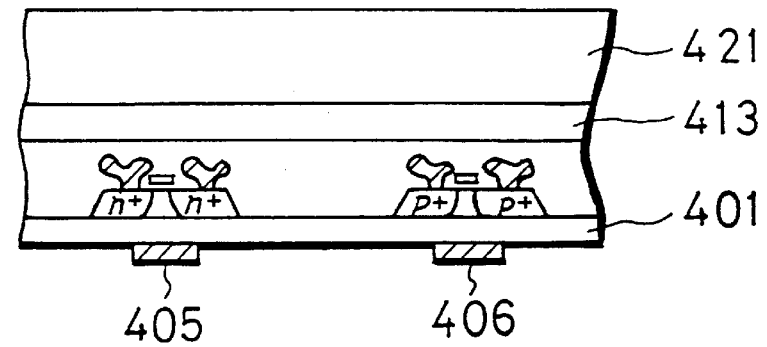
Figure 20:
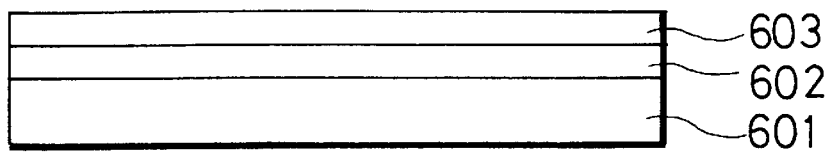
FIGS. 20(a)–20(d) are diagrams showing the fabrication process of the light valve of FIG. 3.
Figure 20:
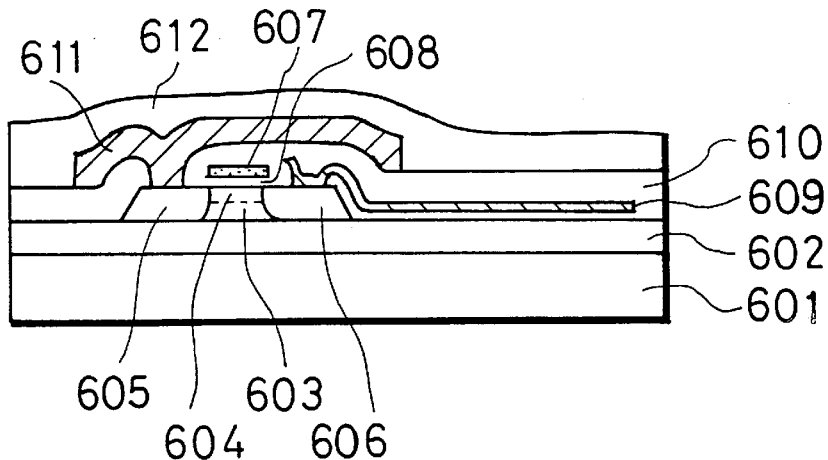
Figure 20:
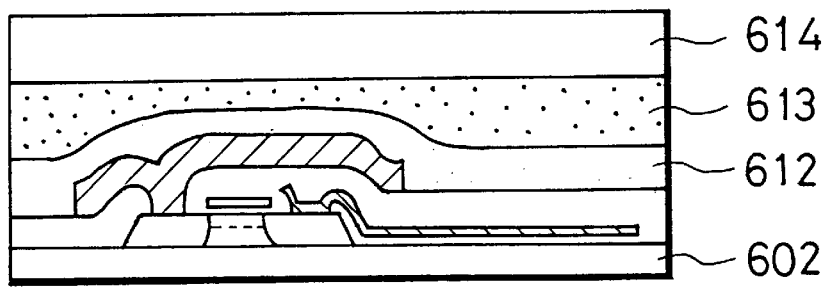
Figure 20:
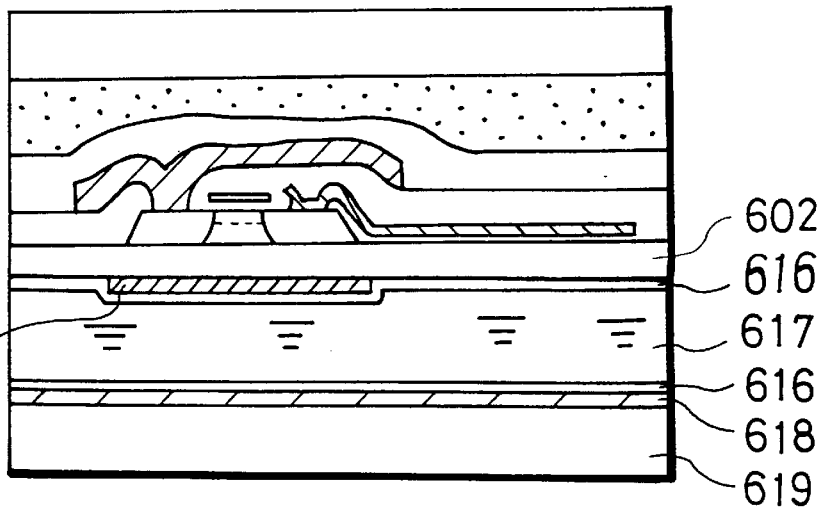

In the embodiment in FIG. 16 and FIG. 17, the thicker the film thickness of the buried insulation film 401, the larger the effect is. The reason therefor will be explained hereinafter. FIG. 18 is an illustrative view showing the relationship between the threshold voltage fluctuation amount $\Delta$VTH and the substrate electric potential in the MOS type transistor as using a parameter of the film thickness of the gate insulation film.

As shown in FIG. 18, the threshold voltage fluctuation amount $\Delta$VTH with respect to the change in the substrate electric potential is larger when the gate insulation film is thick than when it is thin.

In other words, incidence of the threshold voltage fluctuation due to the change in the substrate electric potential is more apt to take place when the film thickness of the gate insulation film is thick.

In FIG. 16 and FIG. 17, when it is assumed that the buried insulation film 401 is the gate insulation film and the electrodes 405 and 406 are the gate electrode, one MOS type transistor can be recognized.

In this case, the film thickness of the buried insulation film 401 is set to be thinner, preferably to be equal to or not more than the film thickness of the gate insulation film 420, thereby it becomes possible to constantly maintain the electric potential of the portion between the source and the drain even during incident light radiation, which effectively acts to suppress the OFF leak current of the transistor.

FIGS. 19(a)–19(d) show the process for fabricating the composite substrate of FIG. 17.

Referring to the step of FIG. 19(a), an integrated circuit including an n-channel MOS transistor 403 and a p-channel MOS transistor 404 is fabricated according to a known fabrication process for integrated circuits. Further, a protective layer 412 is deposited on the integrated circuit thus fabricated.

Next, a support substrate 421 is bonded on the structure of FIG. 19(a) as shown in FIG. 19(b) with an adhesive layer 413 interposed therebetween. In the applications wherein transmission of light is required such as in a light valve, the adhesive layer 413 and the support substrate 421 are formed of a transparent material.

Next, as shown in FIG. 19(c), a silicon layer 420 forming the support substrate of an SOI structure is subjected to an etching that typically employs an etchant such as a KOH solution or hydrazine. There, the etching stops spontaneously upon exposure of the lower major surface of the insulation layer 401.

Before applying the foregoing etching process, the thickness of the silicon support substrate 420 may be substantially reduced by polishing, and the like.

Next, as shown in FIG. 19(d), the electrodes 405 and 406 are provided on the lower major surface of the insulation layer 401 in correspondence with the n-channel MOS transistor 403 and the p-channel MOS transistor 404. The electrodes 405 and 406 may be formed of a metal such as Al or Cr and are deposited by a sputtering process followed by an etching process for removing unnecessary portions therefrom. As a result of the foregoing processes, the composite substrate shown in FIG. 17 is obtained.

After the foregoing steps of FIGS. 19(a)–19(d), the assembling process for the liquid crystal cell is conducted. Thereby, the fabrication of the light valve shown in FIG. 3 is completed. Further, the light valve of FIG. 2 also can be fabricated by a similar process except for the formation of the device isolation region. After the steps of FIG. 19(a)–19(d), the liquid crystal cell is assembled similarly.

In the present invention described heretofore, the insulation layer that forms a part of the SOI substrate on which the MOS transistor is constructed, carries an electrode on the lower major surface thereof. By applying a predetermined voltage, the formation of the inversion layer and hence the formation of the parasitic channel and the bipolar action in the single crystal semiconductor layer at the interface with the lower level insulation layer, are successfully eliminated, even when a light irradiates semiconductor layer. Thereby, the stability in the operation of the integrated circuit is significantly improved.

FIGS. 20(a)–20(d) are diagrams showing the fabrication process of the light valve according to the embodiment described with reference to FIG. 3, wherein the embodiment of FIGS. 20(a)–20(d) shows the case wherein silicon is used for a first substrate 601.

Referring to FIG. 20(a), the process starts with a step for preparing an SOI substrate that includes a single crystal semiconductor layer 603 on the first substrate 601.

With respect to the SOI substrate, at least one of the two single crystal substrates of the application is formed with an insulation film 602 to bond with each other so as to interpose the insulation film, and then one of the single crystal silicon substrate is subjected to thin film formation to give a desired film thickness so as to form a so-called bonding wafer which is preferable because of the superiority in the crystallinity as compared with SOI substrates formed by the SIMOX process or the recrystallization process.

Next, as shown in FIG. 20(b), a MOS transistor forming a light valve switching element is formed such that the MOS transistor includes a drive electrode 609 and an interconnection pattern 611. Herein, an explanation will be given for a case wherein the MOS transistor is an n-channel MOS transistor. First, an ion implantation of a p-type dopant such as B is conducted against the single crystal semiconductor layer 603 with a concentration level that is effective for eliminating the formation of the parasitic channel. For example, B is introduced with a concentration level of $1 \times 10^{17}$ cm$^{-3}$. After the ion implantation, an annealing process is applied to cause a diffusion and activation of the dopants. Thereby, the annealing process is conducted such that the p-type dopant distributes generally uniformly in the single crystal semiconductor layer 603.

When boron is used as the p-type impurity, if the heat treatment is performed in the oxidation atmosphere, the decrease in the impurity concentration is caused due to the segregation in the vicinity of the interface between the single crystal semiconductor thin film layer 603 and the underlying insulation film, so that it is preferable to perform the heat treatment in the nitrogen atmosphere.

Next, the single crystal semiconductor layer 603 is removed by an etching process except for the part where the transistor is formed, such that each transistor to be fabricated is isolated from each other. Of course, the device isolation may be achieved by a LOCOS process that oxidizes the single crystal semiconductor layer 603. When the LOCOS process is applied, the light valve shown in FIG. 2 is fabricated.

Next, a gate insulation film 608 is formed by a thermal oxidation process or CVD process, and an ion implantation of n-type dopant is conducted in correspondence to the surface region of the single crystal semiconductor layer 603 for effecting a threshold voltage control by the way of an ion implantation method, a molecular doping method, or, a pre-deposition method. There, a channel region 604 characterized by an effective concentration level smaller than in the interior of the layer 603 is formed in correspondence to the surface region of the layer 603. Further, if it is necessary, the channel region 604 can be made of n-type semiconductor having low impurity concentration. As the n-type dopant, elements such as As that is characterized by a small thermal diffusion coefficient are preferred. Further, one may use phosphorus (P) or Sb for the n-type dopant. In addition, when the ion implantation energy and the diffusion condition are suitably set in order that the foregoing p-type impurity is high in the internal region of the single crystal semiconductor thin film layer 603 and low in the channel region 604, it is also possible to omit the formation step of the channel region 604 by the introduction of the n-type impurity. After the foregoing ion implantation process, a gate electrode 607 of polysilicon, and the like, is formed on a gate insulation film 608 according a predetermined pattern, and a source region 605 and a drain region 606 are formed at both sides of the gate electrode 607 by an ion implantation of an n-type dopant, such that the source region 605 and the drain region 606 define the channel region 604 therebetween.

On the structure thus fabricated, the drive electrode 609 is connected to the drain region 606 of the n-channel MOS transistor. Further, the interconnection pattern 611 which has a light shielding function is connected to the source region 605. Finally, the overall structure is covered by a protective layer 612 and the drive element of the light valve is completed.

Next, as shown in FIG. 20(c), an adhesive layer 613 is applied on the protective layer 612 and a second support substrate 614 is bonded thereto. Thereby, the adhesive layer 613 provides a planarized surface suitable for bonding the support substrate thereon. By selecting transparent materials for the adhesive layer 613 and the second support substrate 614, the composite substrate suitable for the transmission type light valve is obtained. Next, the first support substrate 601 is removed. In the illustrated example where the substrate 601 is formed of silicon, one can remove the substrate 601 by an etching process that uses an etchant of KOH or hydrazine. Alternatively, one may remove the substrate 601 by polishing. Further, the etching process and polishing process may be combined as necessary, wherein use of etching is advantageous as the etching process stops spontaneously when the insulation layer 602, typically formed of $SiO_2$ or SiN, is exposed.

Next, a shade 615 is formed such that at least the channel region 604 of the MOS transistor that has been formed on the insulation layer 602 in the process of FIG. 20(b), is covered by the shade 615 as shown in FIG. 20(d). Thereby, one can eliminate the shade 615 when the light valve is used for a light having an intensity level that does not affect the operation of the MOS transistor. Further, the shade 615 may be formed of a conductive material such as Al or Cr such that the predetermined voltage can be applied as described with reference to FIG. 17. In the case where a liquid crystal is used for the electro-optical substance 617, a alignment film 616 such as polyimide is provided on the underlying insulation layer 602 and further on the shade 615.

Meanwhile, on the upper major surface of a opposing substrate 619 that is to be provided below the insulation layer 602, an opposing electrode 618 is provided at a side facing the lower major surface of the insulation layer 602, and another alignment film 616 corresponding to the alignment film 616 on the insulation layer 2 is provided thereon. After providing a desired alignment function in the film 616 by a rubbing process, and the like, such that the film 616 acts as an alignment film, the substrate 619 is disposed below the support substrate 614 on which the MOS transistor is formed, such that the substrate 619 is separated from the lower major surface of the insulation layer 602 by a predetermined gap. After filling the gap thus formed by a liquid crystal acting as an electro-optical layer 617, the light valve shown in FIG. 3 is completed.

Although not illustrated, one may bond a third substrate of a transparent material at the lower major surface of the lower level insulation layer 602 by an adhesive layer and remove the second substrate 614 as well as the adhesive layer 613 shown in FIG. 20(C). In this case, a planarization process is conducted upon the protective layer 612 and a alignment film is provided on the upper major surface of the protective layer 612 thus planarized. Further, another substrate carrying thereon an opposing electrode and a corresponding alignment film is provided on the protective layer 612 with a predetermined gap formed therebetween, and an electro-optical substance such as liquid crystal is confined in the gap thus formed. Thereby, the light valve generally identical with the device of FIG. 1 is completed. In this case, the second support substrate 614 and the adhesive layer 613 are not necessary transparent materials. The only difference to the light valve of FIG. 1 exists in the point that the device isolation between the MOS transistors is achieved in the present device by the elimination of the single crystal semiconductor layer, in contrast to the LOCOS process. On the other hand, when a LOCOS process is applied to the device of FIG. 20(d) for the device isolation, a light valve exactly identical with the light valve of FIG. 1 is obtained.

Figure 21:
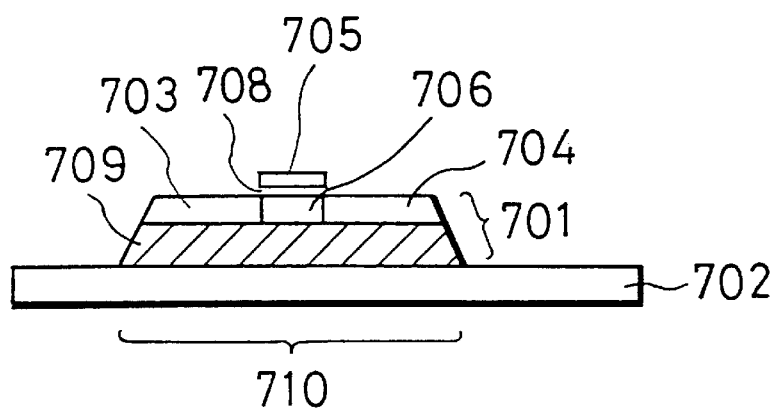
FIG. 21 is an illustrative cross-sectional view showing another embodiment of the MOS type transistor in the light valve according to the present invention.

FIG. 21 is an illustrative cross-sectional view showing another embodiment of the MOS type transistor in the light valve according to the present invention.

A MOS type transistor 710 on an underlying insulation film 702 on a semiconductor thin film layer 701 is formed with a source region 703, a drain region 704, a gate insulation film 708, a gate electrode 705 and a channel region 706 comprising a single crystal semiconductor.

Further, in the internal region other than the source region 703, the drain region 704 and the channel region 706 of the semiconductor thin film layer 701, a carrier recombination region 709 in which a lifetime killer is introduced is formed.

Even when the light is irradiated onto the MOS type transistor shown in FIG. 21 and electrons and positive holes are generated, because of the presence of the region for carrier recombination 709, the generated electrons and positive holes are recombined and extinguished herein. Therefore, no fluctuation in the electric potential takes place in the internal region due to incident light radiation, the occurrence of the backchannel and the bipolar action is effectively prevented, and the increase in the OFF leak current of the transistor is suppressed.

As the lifetime killer, it is preferable to introduce elements such as Si, Au and the like by means of the ion implantation process or the like. In addition, it is effective in the same manner to form the region for carrier recombination 709 which is made polycrystal or amorphous by destroying the crystallinity by means of the ion implantation of Si or the like. The carrier recombination region is preferably formed in the internal region other than the source region 703, the drain region 704 and the channel region 706 in order to reduce the junction leak current, however, in practice, it may be formed to include all or a part of the source region 703 and the drain region 704 provided that there are advantages of simplification in the fabrication steps and the like, and the junction leak current has no problem on the use of the device.

FIG. 22 (*a*) to FIG. 22 (*d*) are cross-sectional views in the order of fabrication steps in the fabrication process for the light valve containing the MOS type transistor shown in FIG. 21.

With respect to FIG. 22 (*a*) to FIG. 22 (*d*), explanation is made for a case in which a first support substrate 901 is silicon.

At first, as shown in FIG. 22 (*a*), an SOI substrate, which has a single crystal semiconductor thin film layer 903 on the first support substrate 901 through an underlying insulation film 902, is prepared. The SOI substrate is preferably one formed by the "bonding process" as explained in FIG. 20 (*a*).

Next, as shown in FIG. 22 (*b*), using an ordinary IC process, an element for a light valve consisting of a MOS type transistor, a driving electrode 909, a wiring 911 and the like is formed. At first, lifetime killer atoms such as gold, silicon and the like are introduced into the internal region in the single crystal semiconductor thin film layer 903 except for the surface side to serve as a channel region 904 thereafter by means of the ion implantation process or the like. Alternatively, the crystallinity of the internal region is destroyed by means of the ion implantation or the like with silicon or the like so as to give polycrystal formation or amorphous formation, thereby a carrier recombination region 920 is formed.

Next, the single crystal semiconductor thin film layer 903 other than the transistor formation region is eliminated by etching so as to perform separation of each transistor. This element separation step may be in accordance with the LOCOS process which is performed with oxidizing the single crystal semiconductor thin film layer 903.

Next, the gate insulation film 908 is formed by the thermal oxidation process or the like, an impurity for controlling the threshold voltage of the transistor is introduced by the ion implantation process or the like, and the channel region 904 is formed. Subsequently, a gate electrode 907 consisting of polysilicon or the like is formed to have a predetermined shape on the gate insulation film 908, and a source region 905 and a drain region 906 are formed by the ion implantation process or the like so as to interpose the channel region 904 under the gate electrode 907.

In this case, the foregoing formation step of the region for carrier recombination may be performed after the element separation step. In addition, in the foregoing fablication process, if the source region 905 and the drain region 906 are formed deeply, they overlap the region for carrier recombination 920.

From a viewpoint of characteristics of the device, it is preferable that the source region 905 and the drain region 906 are formed to be shallow, so as to be equal to or not more than the channel region 904 in order not to overlap the region for carrier recombination 920.

In addition, although not shown in the figure, with respect to the fablication step of the SOI substrate shown in FIG. 22 (*a*), when a layer to serve as the region for carrier recombination 920 is formed beforehand by forming a polycrystal silicon or an amorphous silicon layer, or by introducing a lifetime killer between the underlying insulation film 902 and the single crystal semiconductor layer 903, and the single crystal semiconductor thin film layer 903 is formed to have a film thickness coincident with the film thickness of the channel region 904, then it becomes unnecessary to newly form the region for carrier recombination 920 in the IC process.

On the structure thus fabricated, the drive electrode 909 is connected to the drain region 606 of the n-channel MOS transistor. Further, the interconnection pattern 611 which has a light shielding function is connected to the source region 905. Finally, the overall structure is covered by a protective layer 912 and the drive element of the light valve is completed.

Next, as shown in FIG. 22(*c*), an adhesive layer 913 is applied on the protective layer 912 and a second support substrate 914 is bonded thereto. Thereby, the adhesive layer 913 provides a planarized surface suitable for bonding the support substrate thereon. By selecting transparent materials for the adhesive layer 913 and the second support substrate 914, the composite substrate suitable for the transmission type light valve is obtained. Next, the first support substrate 901 is removed. In the illustrated example where the substrate 901 is formed of silicon, one can remove the substrate 901 by an etching process that uses an etchant of KOH or hydrazine. Alternatively, one may remove the substrate 901 by polishing. Further, the etching process and polishing process may be combined as necessary, wherein use of etching is advantageous as the etching process stops spontaneously when the insulation layer 902, typically formed of $SiO_2$ or SiN, is exposed.

Next, a shade 915 is formed such that at least the channel region 904 of the MOS transistor that has been formed on the insulation layer 902 in the process of FIG. 22(*b*), is covered by the shade 915 as shown in FIG. 22(*d*). Thereby, one can eliminate the shade 915 when the light valve is used for a light having an intensity level that does not affect the operation of the MOS transistor. Further, the shade 915 may be formed of a conductive material such as Al or Cr such that the predetermined voltage can be applied as described with reference to FIG. 17. In the case where a liquid crystal is used for the electro-optical substance 917, a alignment film 616 such as polyimide is provided on the underlying insulation layer 902 and further on the shade 915.

Meanwhile, on the upper major surface of a opposing substrate 919 that is to be provided below the insulation layer 902, an opposing electrode 918 is provided at a side facing the lower major surface of the insulation layer 902, and another alignment film 616 corresponding to the alignment film 916 on the insulation layer 2 is provided thereon. After providing a desired alignment function in the film 916 by a rubbing process, and the like, such that the film 916 acts as a alignment film, the substrate 919 is disposed below the support substrate 914 on which the MOS transistor is formed, such that the substrate 919 is separated from the lower major surface of the insulation layer 902 by a predetermined gap. After filling the gap thus formed by a liquid crystal acting as an electro-optical layer 917, the light valve shown in FIG. 3 is completed.

Figure 22A:
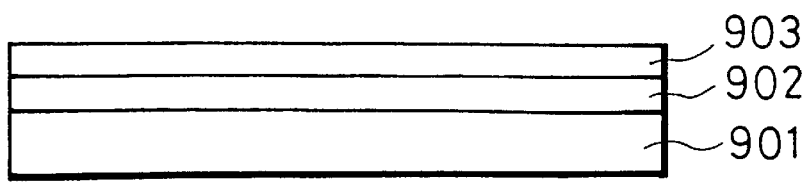
FIG. 22 (a) to FIG. 22 (d) are cross-sectional views in the order of fablication steps in the fablication process for the light valve containing the MOS type transistor shown in FIG. 21.
Figure 22B:
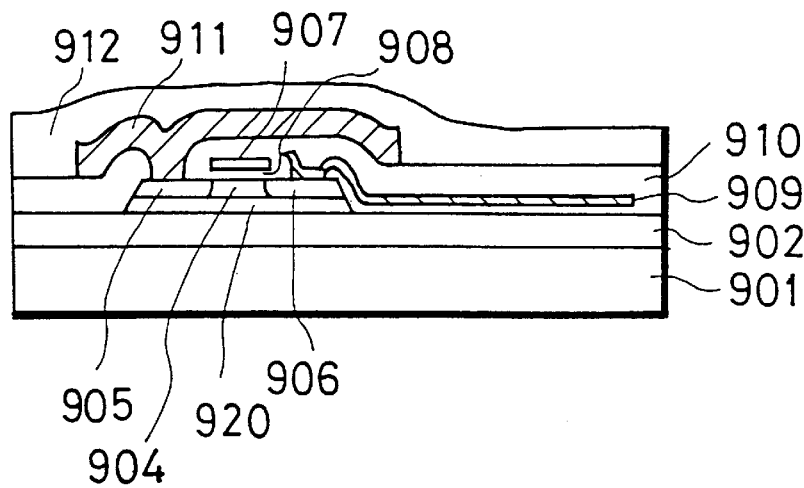
Figure 22C:
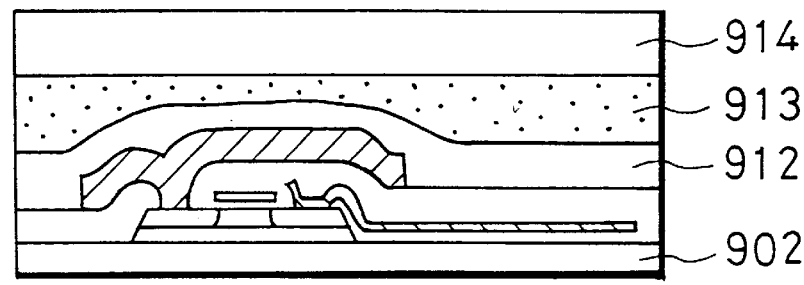
Figure 22D:
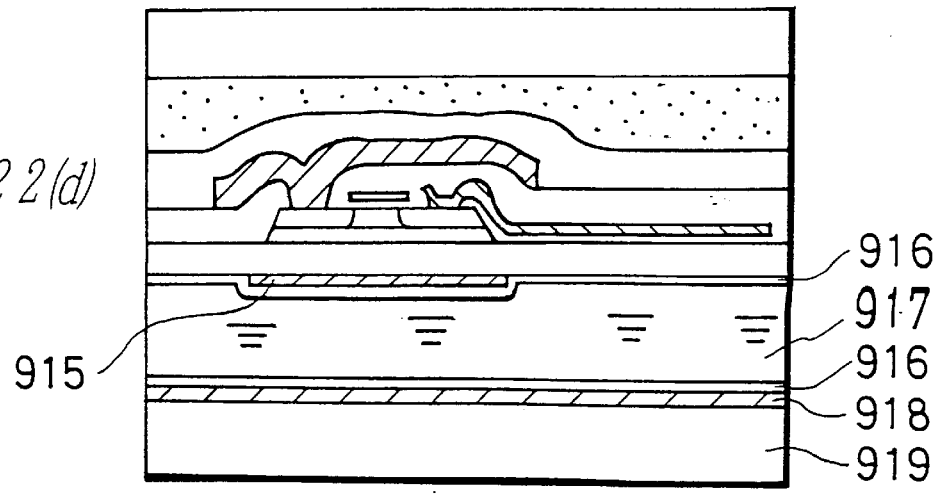

Although not illustrated, one may bond a third substrate of a transparent material at the lower major surface of the lower level insulation layer 902 by an adhesive layer and remove the second substrate 914 as well as the adhesive layer 913 shown in FIG. 22(C). In this case, a planarization process is conducted upon the protective layer 912 and a alignment film is provided on the upper major surface of the protective layer 912 thus planarized. Further, another substrate carrying thereon an opposing electrode and a corresponding alignment film is provided on the protective layer 912 with a predetermined gap formed therebetween, and an electro-optical substance such as liquid crystal is confined in the gap thus formed. Thereby, the light valve generally identical with the device of FIG. 1 is completed. In this case, the second support substrate 614 and the adhesive layer 613 are not necessary transparent materials.

Figure 23:
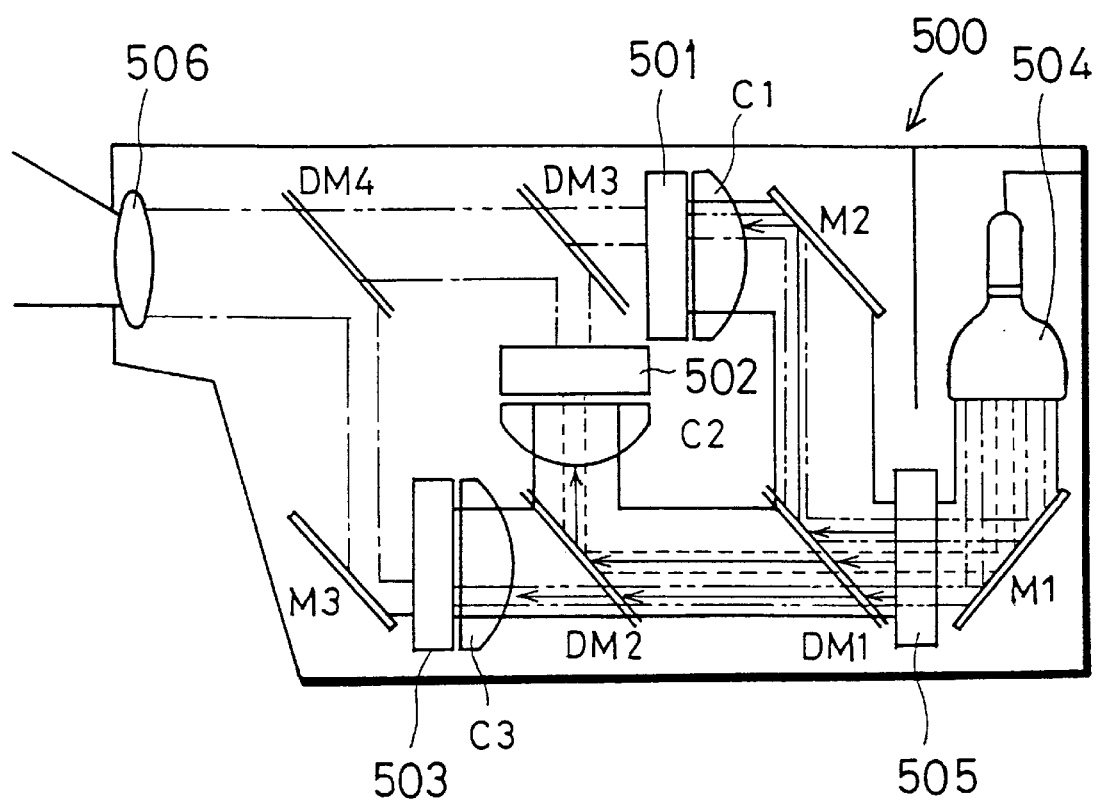
FIG. 23 is a diagram showing an image projector in which the light valve of the present invention is used.

FIG. 23 shows an application that uses the light valve of the present invention, wherein the light valve of the present invention is used for a video projector. Referring to FIG. 23 showing a video projector 500 in a cross sectional view, it will be noted that the video projector 500 includes three active matrix light valves 501–503 each of the transmission type. White light produced by a lamp 504 is decomposed into red, blue and green lights by a color decomposition filter 505, after reflection by a mirror M1. After reflection at the mirror M1, the red light is selectively reflected by a dichroic mirror DM1 and enters into a condenser lens C1 after reflection at a mirror M2. After passing through the condenser lens C1, the red light enters to a first light valve 501. There, the red light is modulated at the light valve 501 upon passage therethrough by a video signal and is directed to a magnification lens 506 after being reflected by dichroic mirrors DM3 and DM4. Thereby, the lens 506 projects an image corresponding to the red light thus modulated on a screen. Similarly, the blue light passed through the dichroic mirror DM1 is selectively reflected by a dichroic mirror DM2 and is concentrated by a condenser lens C2. Thereby, the blue light thus passed through the lens C2 enters a second light valve 502. Upon passage through the second light valve 502, the blue light is modulated by a video signal and enters the magnification lens 506 that is used commonly for all the three primary colors, via the dichroic mirrors DM3 and DM4. Further, the green light enters into a condenser lens C3 after passing through the dichroic mirrors DM1 and DM2, and the green light enters into a third light valve 503 for modulation by a video signal. After passage through the third light valve 503, the green light is reflected by a mirror M3 as well as by the dichroic mirror DM4 and is directed to the magnification lens 506. The three primary colors thus modulated individually by the three light valves merge with each other at the magnification lens 506 and a two-dimensional image is projected on the front screen as a synthesis of the three primary color images. Since the OFF leakage current in the MOS transistor is suppressed even if a light irradiates onto the transistor, the projector using the above stated light valve shown in FIGS. 1 to 3 and FIGS. 5 to 23 can be driven stably. The light valve used in the foregoing projector can be constructed with a size in the order of centimeters, and the size of various optical elements and the lamp can be reduced accordingly. Thereby, one can construct the video projector 500 significantly smaller as compared with conventional devices.

What is claimed is:

1. A light valve for modifying an optical transmission characteristic of an electro-optical substance, comprising: a composite substrate comprising a semiconductor thin film layer provided on a first surface of an underlying insulation layer; a MOS transistor formed on said semiconductor thin film layer and comprising a source region, a drain region, a channel region between the source region and the drain region and being formed of a single crystal semiconductor material having a thickness of not more than 0.3 microns, an internal region located below the channel region, a gate insulation film provided on a surface of said semiconductor thin film layer over the channel region, and a gate electrode provided on said gate insulation film; a pixel electrode provided on said composite substrate in electrical contact with said drain region of said MOS transistor; an opposing substrate bonded to and opposing said composite substrate with a predetermined gap formed therebetween; and an electro-optical material confined within the gap; wherein said MOS transistor is operative to selectively supply an electrical signal to said pixel electrode to change an optical transmission characteristic of the electro-optical material wherein a leakage current of said MOS transistor caused by incident light radiation onto said single crystal semiconductor thin film layer is suppressed.

2. A light valve according to; wherein an impurity concentration level of said channel region in said MOS transistor is lower than an impurity concentration of the internal region.

3. A light valve according to claim 1; wherein the semiconductor thin film layer is of a first conductivity type, the source region and the drain region are of a second conductivity type, the channel region is of the first conductivity type, and the internal region is of the first conductivity type and has an impurity concentration sufficient to prevent formation of a parasitic channel proximate an interface between the underlying insulation layer and the semiconductor thin film layer and to prevent a bipolar action from occurring between said source region and said drain region.

4. A light valve according to claim 1; wherein said channel region is of the same conductivity type as said source region and said drain region, and the internal region has a conductivity type opposite to that of the source region and the drain region.

5. A light valve according to claim 1; wherein said semiconductor thin film layer has a first conductivity type, said source region and said drain region have a second conductivity type, at least one of said source region and said drain region being formed to contact said underlying insulation layer, and wherein a portion of the internal region in the vicinity of an interface between at least one of said source region and said drain region has a higher impurity concentration level than the remaining portion of the internal region to prevent formation of a parasitic channel in the vicinity of an interface between the semiconductor thin film layer and the underlying insulation layer.

6. A light valve according to claim 1; further comprising a conductive layer provided on a second surface of said underlying insulation layer opposite the first: surface and under the internal region; and means for supplying voltage to the conductive layer to prevent formation of a parasitic channel in the vicinity of an interface between the semiconductor thin film layer and the underlying insulation layer due to incident light radiation.

7. A light valve according to claim 1 wherein the MOS type transistor is of a lightly doped drain structure.

8. A light valve according to claim 1; wherein the internal region includes carrier recombination means for recombining and extinguishing carriers of electrons and holes generated by light radiation.

9. A light valve according to claim 8; wherein the carrier recombination means comprises lifetime killer atoms provided in the internal region.

10. A light valve according to claim 8; wherein the internal region has a crystal structure that is polycrystal or amorphous.

11. An image projector for projecting an image, comprising: a light source for producing a light beam; a light valve receptive of the light beam for selectively transmitting the light beam in accordance with an image; and a lens for projecting the transmitted light beam with a magnification; wherein the light valve comprises: a composite substrate comprising a single crystal layer of a semiconductor material of not more than 0.3 μm in thickness on which a plurality of MOS transistors and corresponding pixel electrodes are formed, said pixel electrodes being activated by a corresponding MOS transistor; an opposing substrate bonded to and opposing the composite substrate with a gap formed therebetween; and an electro-optical substance confined within the gap; said composite substrate including an underlying insulation layer on which said single crystal layer is provided; said MOS transistor comprising a channel region formed in said single crystal layers, a source region and a drain region provided in said single crystal layer at both sides of said channel region, a gate insulation film provided on said single crystal layer in opposed relation to said channel region, and a gate electrode provided on said gate insulation film; said pixel electrodes being provided on said insulation layer and being electrically connected to respective regions of corresponding MOS transistors; said single crystal layer further including means for eliminating formation of a backchannel between said source and drain regions along an interface with the underlying insulation layer.

12. A light valve for modifying an optical transmission characteristic of an electro-optical substance, comprising: a composite substrate comprising a single crystal semiconductor thin-film layer provided on a first surface of an underlying insulation layer; a MOS transistor comprising a source region, a drain region, a channel region located between the source region and the drain region in the single crystal semiconductor thin-film layer, and a gate electrode provided on the underlying insulation layer on a second surface thereof opposite the first surface; a pixel electrode provided over the composite substrate and in electrical contact with the MOS transistor; an opposing substrate bonded to the composite substrate and opposing the single crystal semiconductor thin film layer with a predetermined gap therebetween; and an electro-optical material filled in the predetermined gap; wherein the MOS transistor selectively supplies an electrical signal to the pixel electrode for activating the electro-optical material; and the single crystal semiconductor thin-film layer has a thickness not more than 0.3 $\mu$m effective to suppress a leakage current of the MOS transistor due to incident light.

13. A light valve according to claim 12; further comprising an internal region located under the channel region in the single crystal semiconductor thin-film layer; wherein the internal region has a first conductivity type, the source region and the drain region have a second conductivity type, and the internal region has an impurity concentration sufficient to suppress a leakage current caused by a parasitic channel in the vicinity of an interface between the single crystal semiconductor thin-film layer and the underlying insulation layer due to incident light irradiation onto the composite substrate.

14. A light valve according to claim 13; wherein the impurity concentration level in the channel region is lower than that of the internal region.

15. A light valve according to claim 13; wherein the channel region has a second conductivity type.

16. A light valve according to claim 12; further comprising an internal region located under the channel region in the single crystal semiconductor thin-film layer; wherein the internal region has a first conductivity type, the source region and the drain region have a second conductivity type, at least one of the source region and the drain region is formed to contact the underlying insulation layer, and a portion of the internal region in the vicinity between one of the source region and the drain region and the underlying insulation layer has an impurity concentration level of the first conductivity type higher than that of the remaining portion of the internal region to prevent formation of a parasitic channel in the vicinity of an interface between the single crystal semiconductor thin-film layer and the underlying insulation layer due to incident light irradiation.

17. A light valve according to claim 12; further comprising an internal region located under the channel region in the single crystal semiconductor thin-film layer; a conductive layer provided on the underlying insulation layer on a second surface opposite the first surface and in alignment with the channel region; and voltage supplying means for supplying the conductive layer with a predetermined voltage to prevent formation of a parasitic channel in the vicinity of an interface between the single crystal semiconductor layer and the underlying insulation layer due to incident light radiation.

18. A light valve according to claim 12; further comprising an internal region located under the channel region in the single crystal semiconductor thin film layer; wherein the internal region includes carrier recombination means for recombining and extinguishing carriers of electrons and holes generated by light irradiation onto the composite substrate so as to suppress a leakage current in the MOS transistor.

19. A light valve according to claim 18; wherein the recombination means comprises lifetime killer atoms in the internal region.

* * * * *